(12) United States Patent
Hashimoto

(10) Patent No.: US 9,239,758 B2
(45) Date of Patent: *Jan. 19, 2016

(54) SEMICONDUCTOR STORAGE DEVICE, METHOD FOR CONTROLLING THE SAME AND CONTROL PROGRAM

(71) Applicant: KABUSHIKI KAISHA TOSHIBA, Minato-ku (JP)

(72) Inventor: Daisuke Hashimoto, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/613,090

(22) Filed: Feb. 3, 2015

(65) Prior Publication Data
US 2015/0149863 A1 May 28, 2015

Related U.S. Application Data

(63) Continuation of application No. 13/713,442, filed on Dec. 13, 2012, now Pat. No. 8,984,375.

(30) Foreign Application Priority Data

Dec. 16, 2011 (JP) .................. 2011-275866

(51) Int. Cl.
*G06F 11/10* (2006.01)
*G06F 11/00* (2006.01)
(Continued)

(52) U.S. Cl.
CPC .......... *G06F 11/1068* (2013.01); *G06F 11/004* (2013.01); *G11C 16/3404* (2013.01);
(Continued)

(58) Field of Classification Search
CPC ... G06F 11/004; G06F 1/3203; G06F 1/3225; G06F 1/3228; G11C 16/0466; G11C 16/08; G11C 16/10; G11C 16/32; G11C 16/3404; G11C 2029/0409; G11C 2029/0411; G11C 29/42
USPC ......... 714/721, 47.2, 768; 713/300, 320, 324; 712/28; 365/185.18, 185.23, 226

See application file for complete search history.

(56) References Cited

U.S. PATENT DOCUMENTS 5,418,753 A   5/1995 Seki
6,256,243 B1  7/2001 Savignac et al.
(Continued)

FOREIGN PATENT DOCUMENTS

JP   2000-40035    2/2000
JP   2002-269523   9/2002
(Continued)

OTHER PUBLICATIONS

"Information technology—ATA/ATAPI Command Set—2 (ACS-2)", Working Draft Project; American National Standard, T13/2015-D, Revision 6, Feb. 22, 2011, 553 pages.

(Continued)

*Primary Examiner* — Guy Lamarre
(74) *Attorney, Agent, or Firm* — Oblon, McClelland, Maier & Neustadt, L.L.P.

(57) ABSTRACT

According to one embodiment, a semiconductor memory stores a program for causing a memory controller to operate in at least one of first and second modes. In the first mode, for each of the blocks, the memory controller autonomously erases and writes data and reads the written data, and determines that the block or the semiconductor storage device is defective when a count of errors in the read data exceeds a correction capability or a threshold. In the second mode, when error correction of read substantial data fails, the memory controller reads the substantial data which failed in the error correction using a read level shifted from the present read level.

20 Claims, 25 Drawing Sheets

(51) Int. Cl.
  *G11C 16/34* (2006.01)
  *G11C 29/42* (2006.01)
  *G11C 29/52* (2006.01)
  *G11C 29/04* (2006.01)

(52) U.S. Cl.
  CPC ............... *G11C29/42* (2013.01); *G11C 29/52* (2013.01); *G11C 2029/0409* (2013.01); *G11C 2029/0411* (2013.01)

(56) References Cited

U.S. PATENT DOCUMENTS

| | | |
|---|---|---|
| 7,099,190 B2 | 8/2006 | Noguchi et al. |
| 7,453,728 B2 | 11/2008 | Noguchi et al. |
| 7,512,007 B2 | 3/2009 | Terasawa et al. |
| 7,551,478 B2 | 6/2009 | Kanno |
| 7,590,919 B2 | 9/2009 | Kanno |
| 7,596,705 B2 | 9/2009 | Kim |
| 7,613,048 B2 | 11/2009 | Inoue et al. |
| 7,996,726 B2 | 8/2011 | Ito |
| 8,000,927 B2 | 8/2011 | Sukegawa |
| 8,037,380 B2 | 10/2011 | Cagno et al. |
| 8,189,391 B2 | 5/2012 | Itagaki et al. |
| 8,539,315 B2 | 9/2013 | Hashimoto |
| 2006/0206738 A1 | 9/2006 | Jeddeloh et al. |
| 2007/0201274 A1* | 8/2007 | Yu et al. ............... 365/185.09 |
| 2009/0175066 A1 | 7/2009 | Kim |
| 2009/0228641 A1 | 9/2009 | Kurashige |
| 2009/0292972 A1 | 11/2009 | Seol et al. |
| 2010/0207195 A1 | 8/2010 | Fukuzumi et al. |
| 2010/0254191 A1 | 10/2010 | Son et al. |
| 2011/0239083 A1 | 9/2011 | Kanno |
| 2011/0273834 A1 | 11/2011 | Moriai et al. |
| 2012/0268994 A1 | 10/2012 | Nagashima |
| 2012/0284453 A1 | 11/2012 | Hashimoto |
| 2013/0124932 A1 | 5/2013 | Schuh et al. |

FOREIGN PATENT DOCUMENTS

| | | |
|---|---|---|
| JP | 2007-272635 | 10/2007 |
| JP | 2009-514088 | 4/2009 |
| JP | 2011-29365 | 2/2011 |
| JP | 2011-29586 | 2/2011 |
| JP | 2011-100519 | 5/2011 |
| JP | 2011-238346 | 11/2011 |
| WO | 2011/055749 A1 | 5/2011 |

OTHER PUBLICATIONS

"NVM Express", NVM Express, Revision 1.1, Oct. 11, 2012, 163 pages.
"Serial ATA International Organization: Serial ATA Revision 2.6", Serial ATA, Revision 2.6, Feb. 15, 2007, 594 pages.
"SFF-8639 Specification for Multifunction 12 Gb/s 6X Unshielded Connector", ftp://ftp.seagate.com/sff, Revision 1.5, Nov. 9, 2012, 29 pages.

* cited by examiner

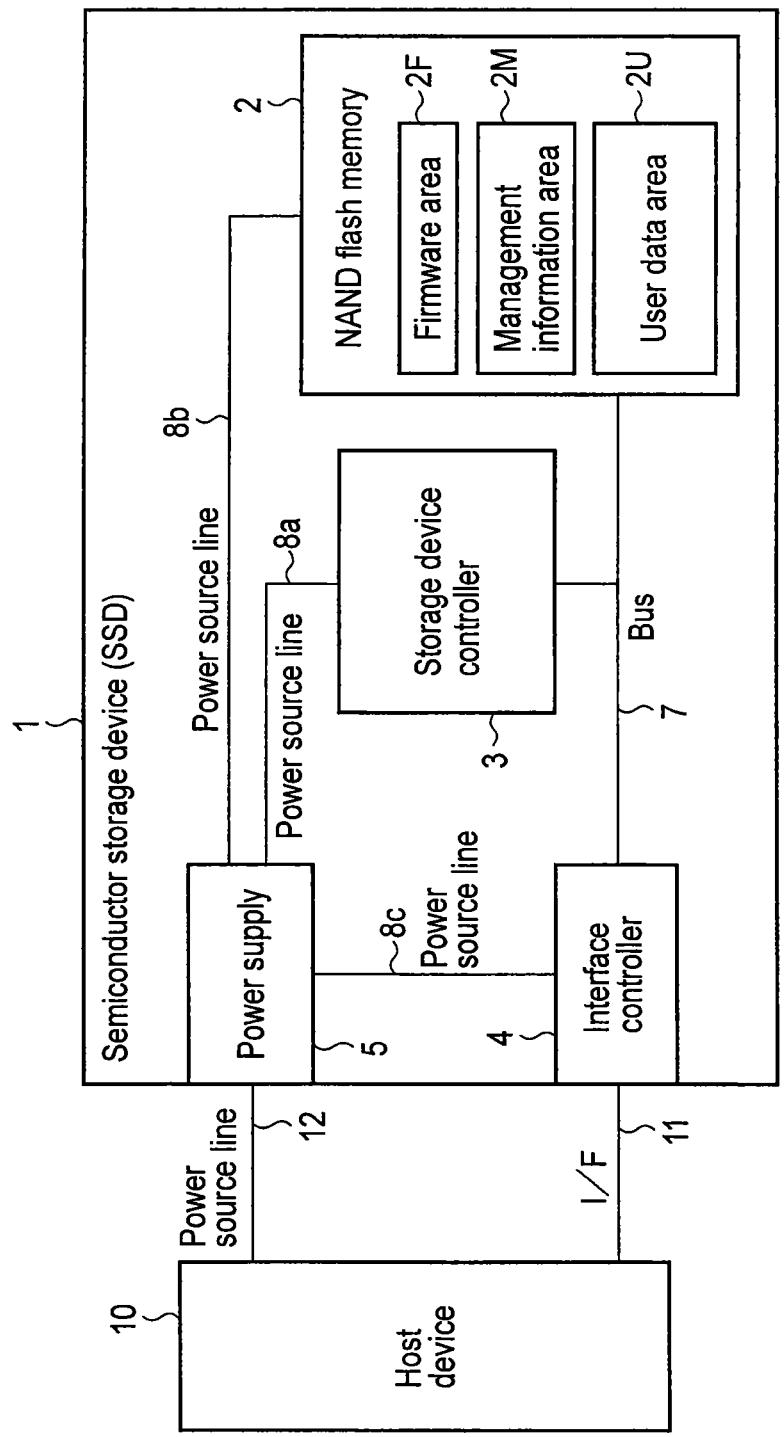
F I G. 1

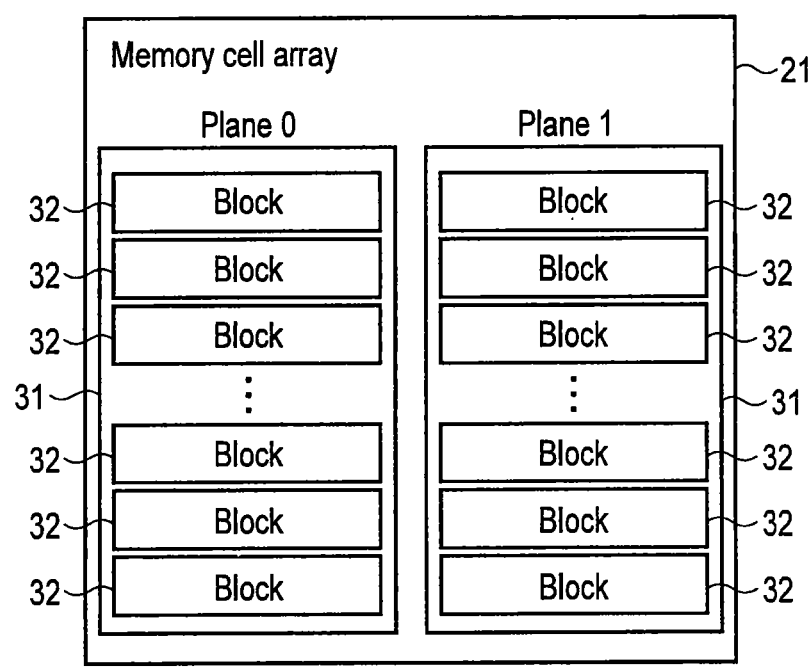
F I G. 5

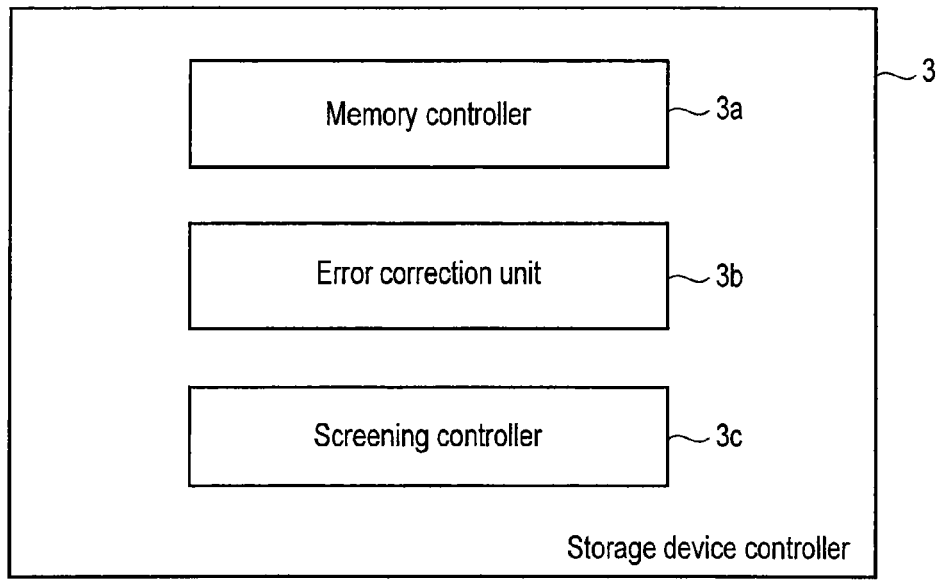
F I G. 1 3
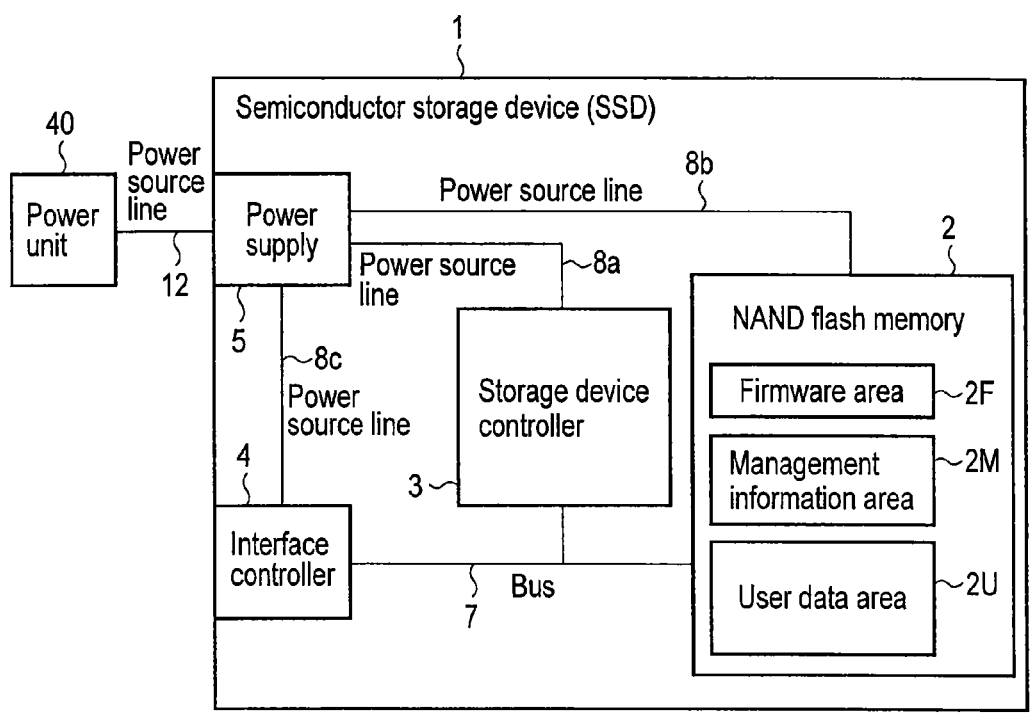
F I G. 1 4

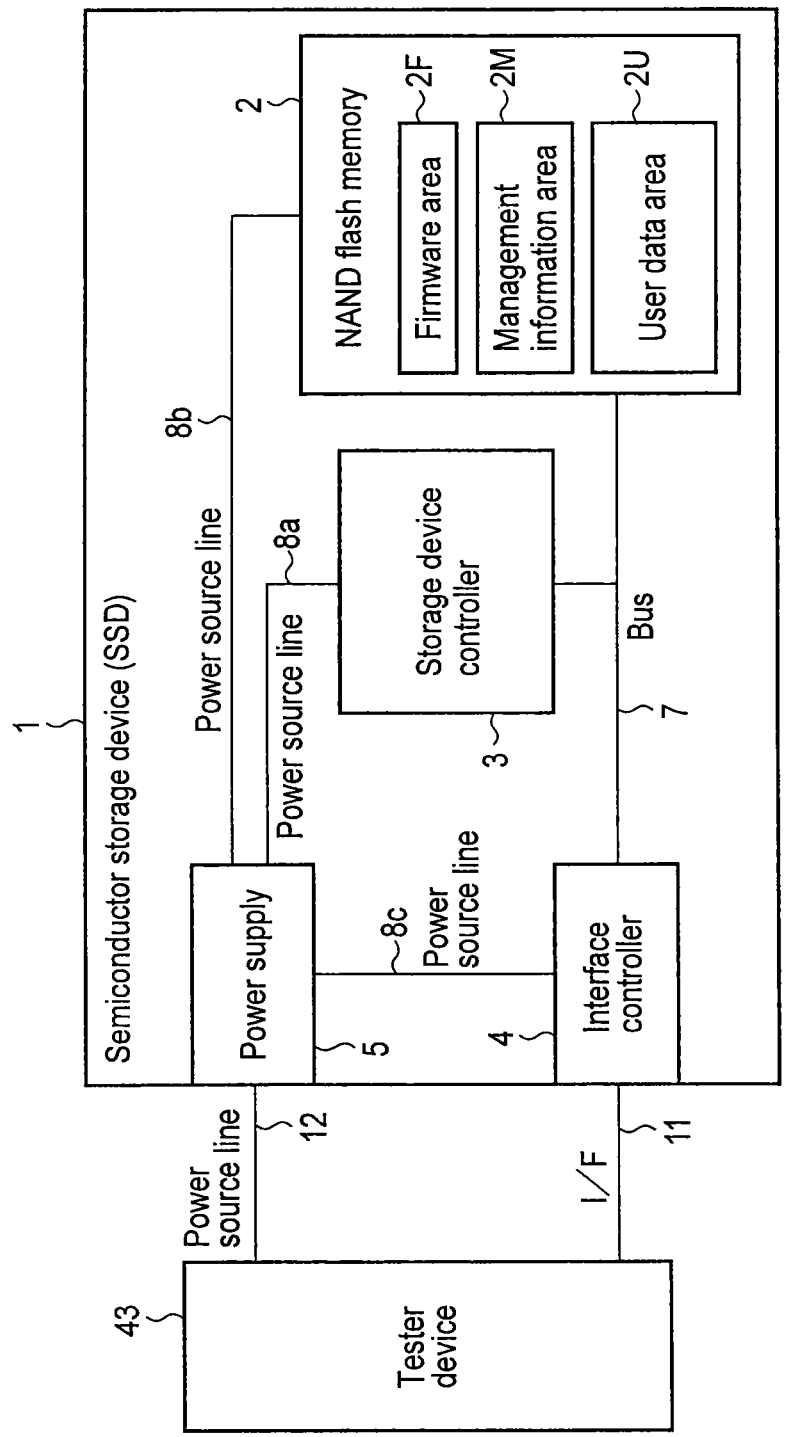
F I G. 20

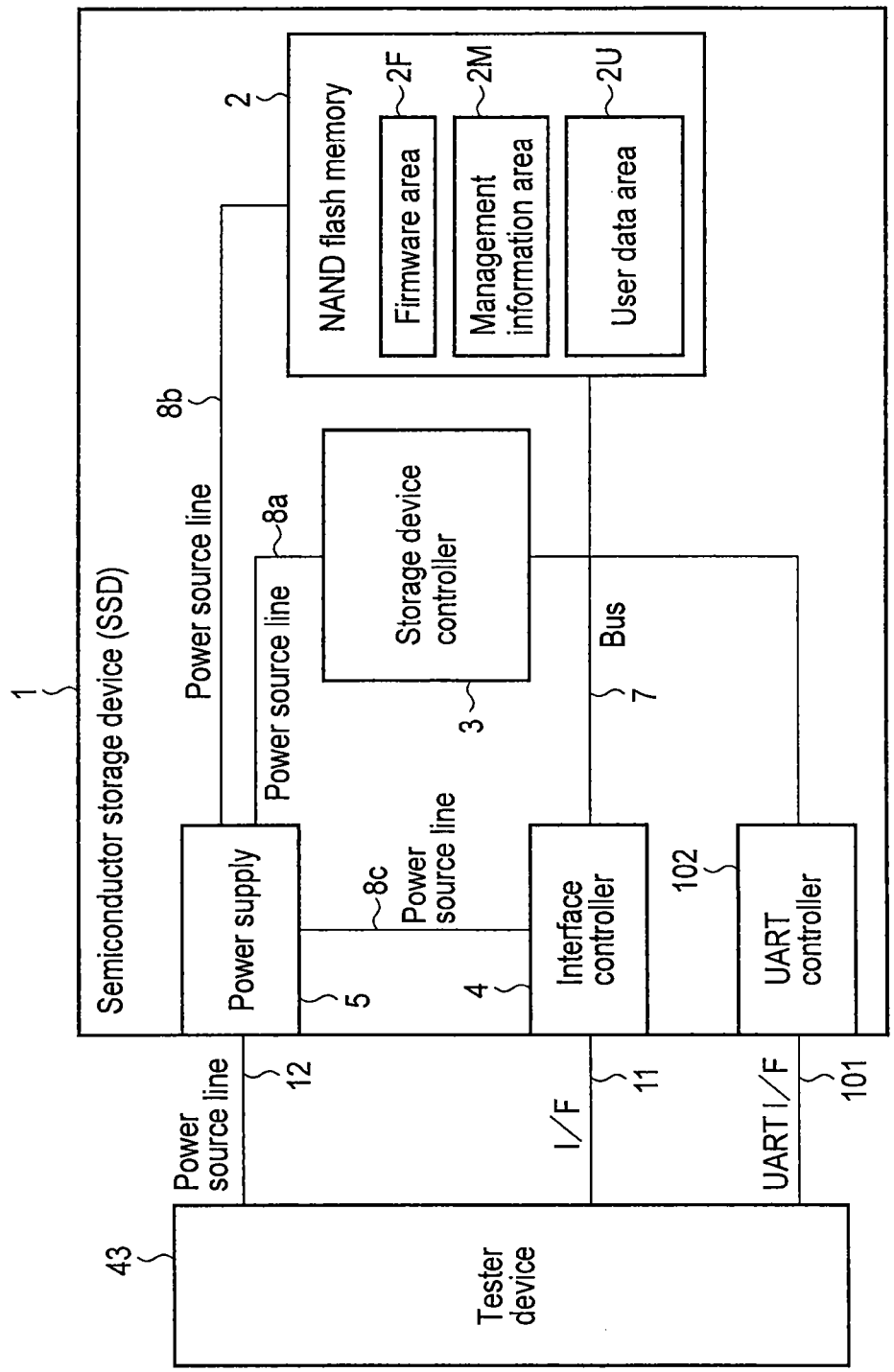
F I G. 21

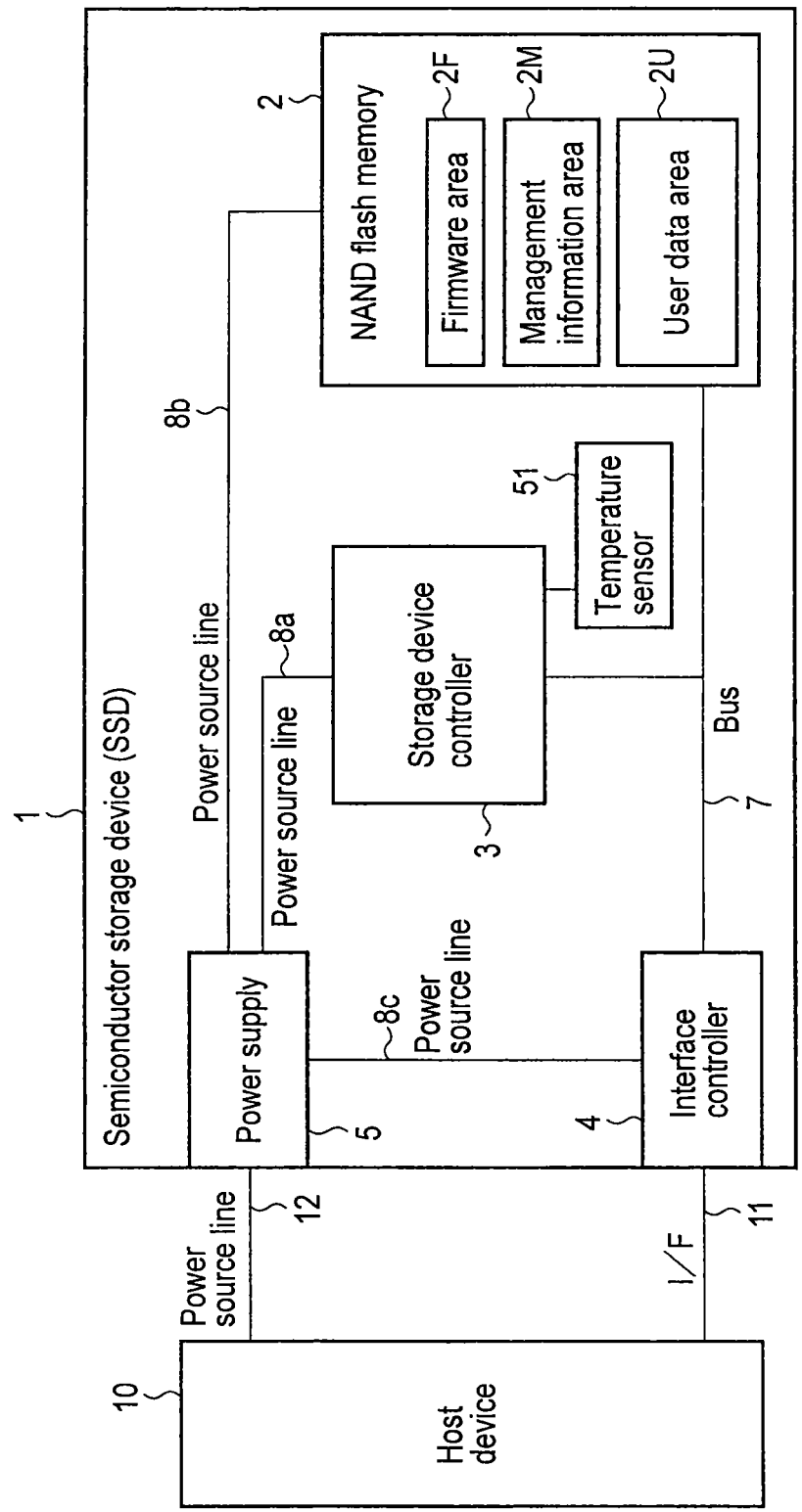
F I G. 24

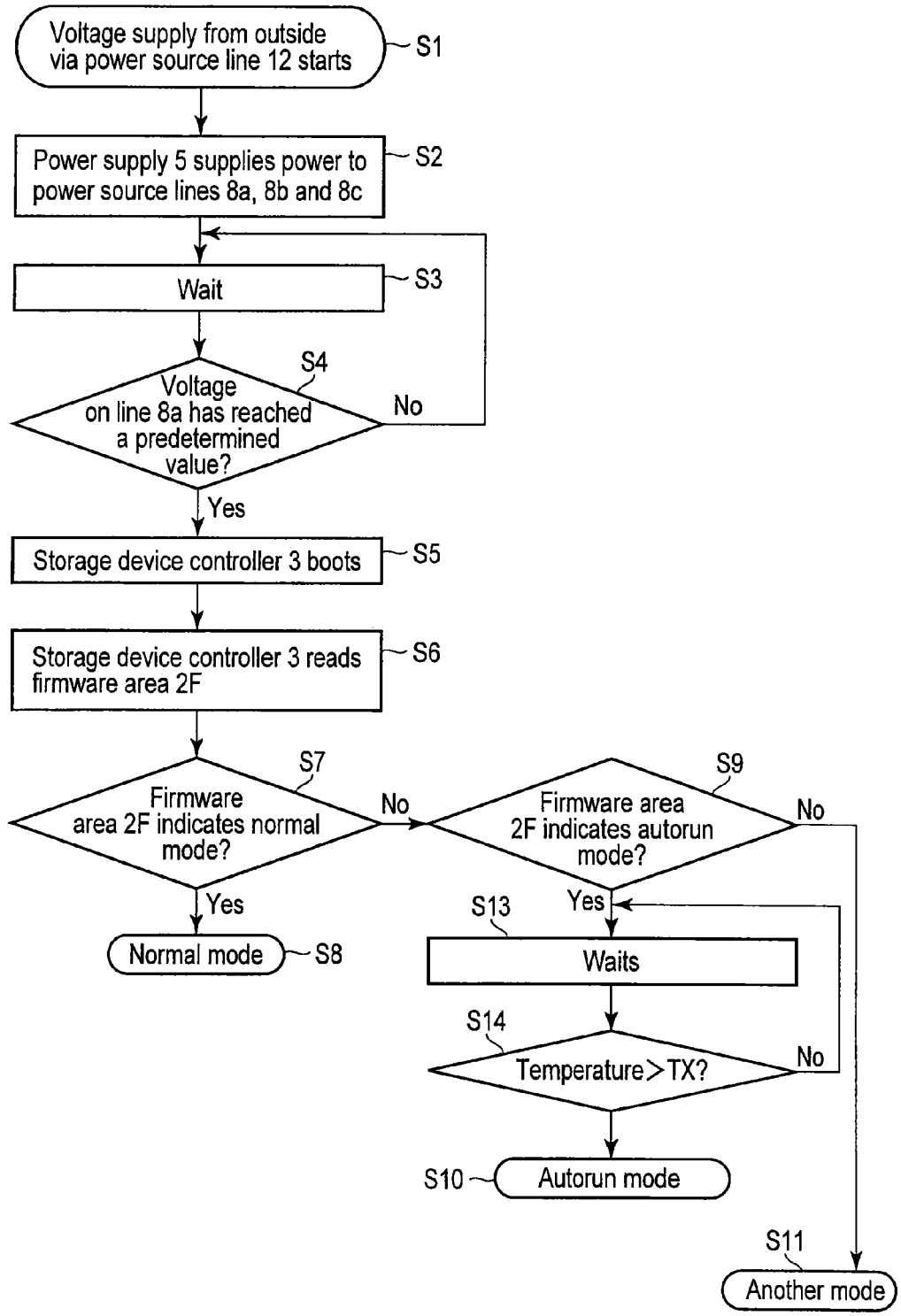
F I G. 25

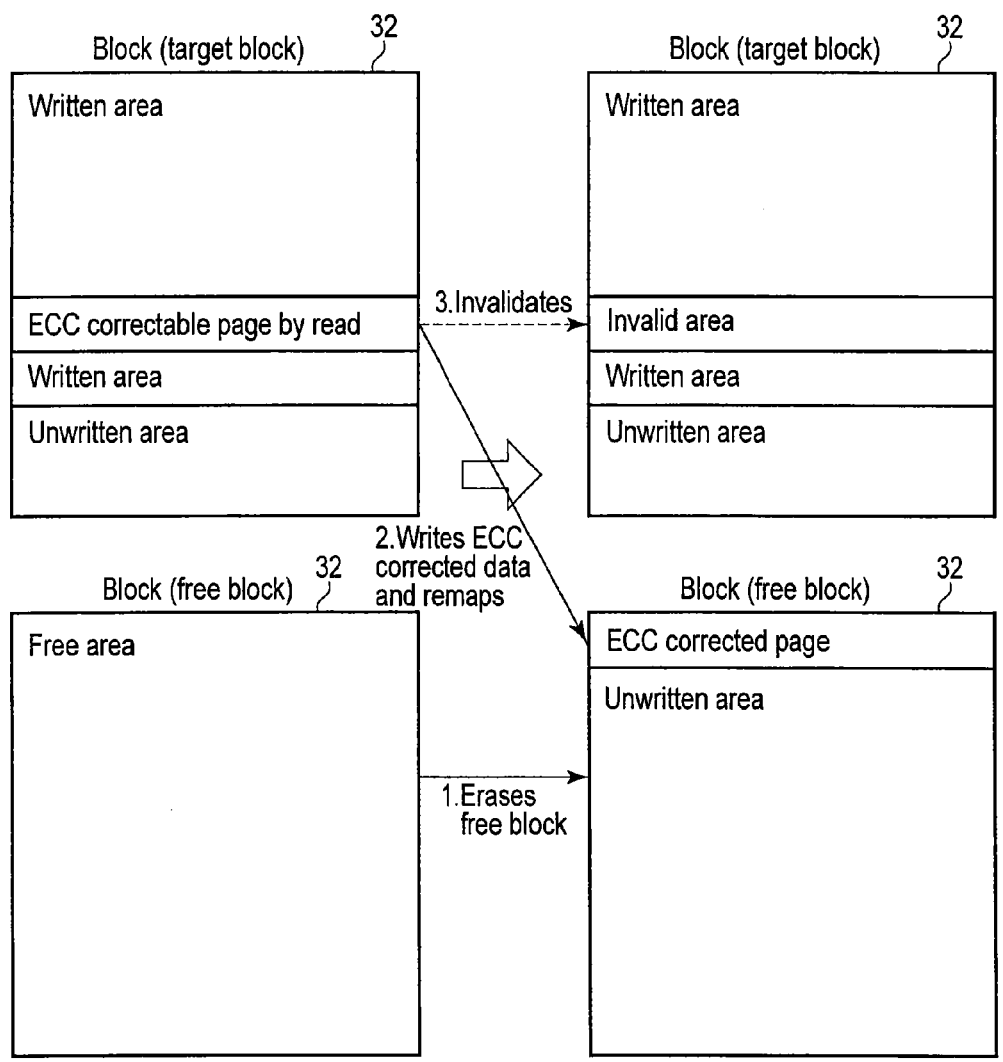
F I G. 2 8

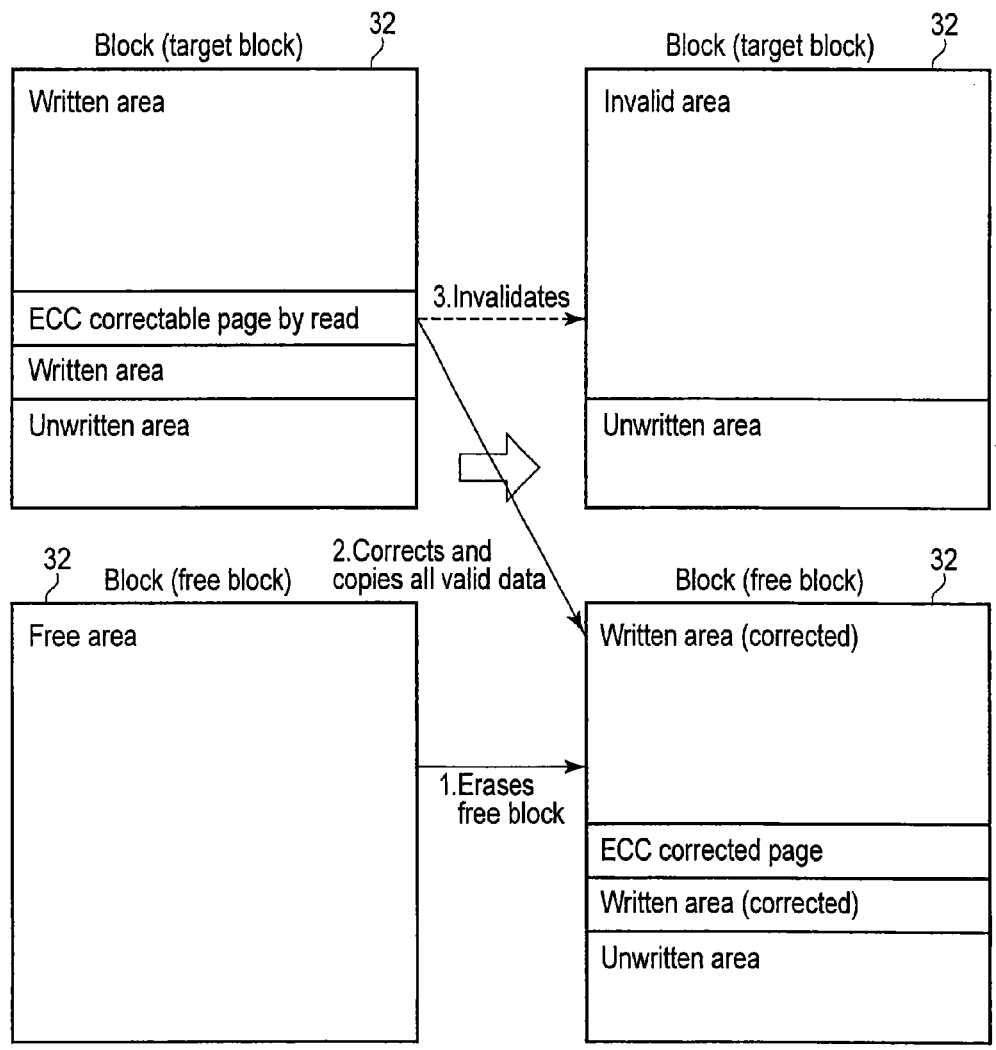
F I G. 29

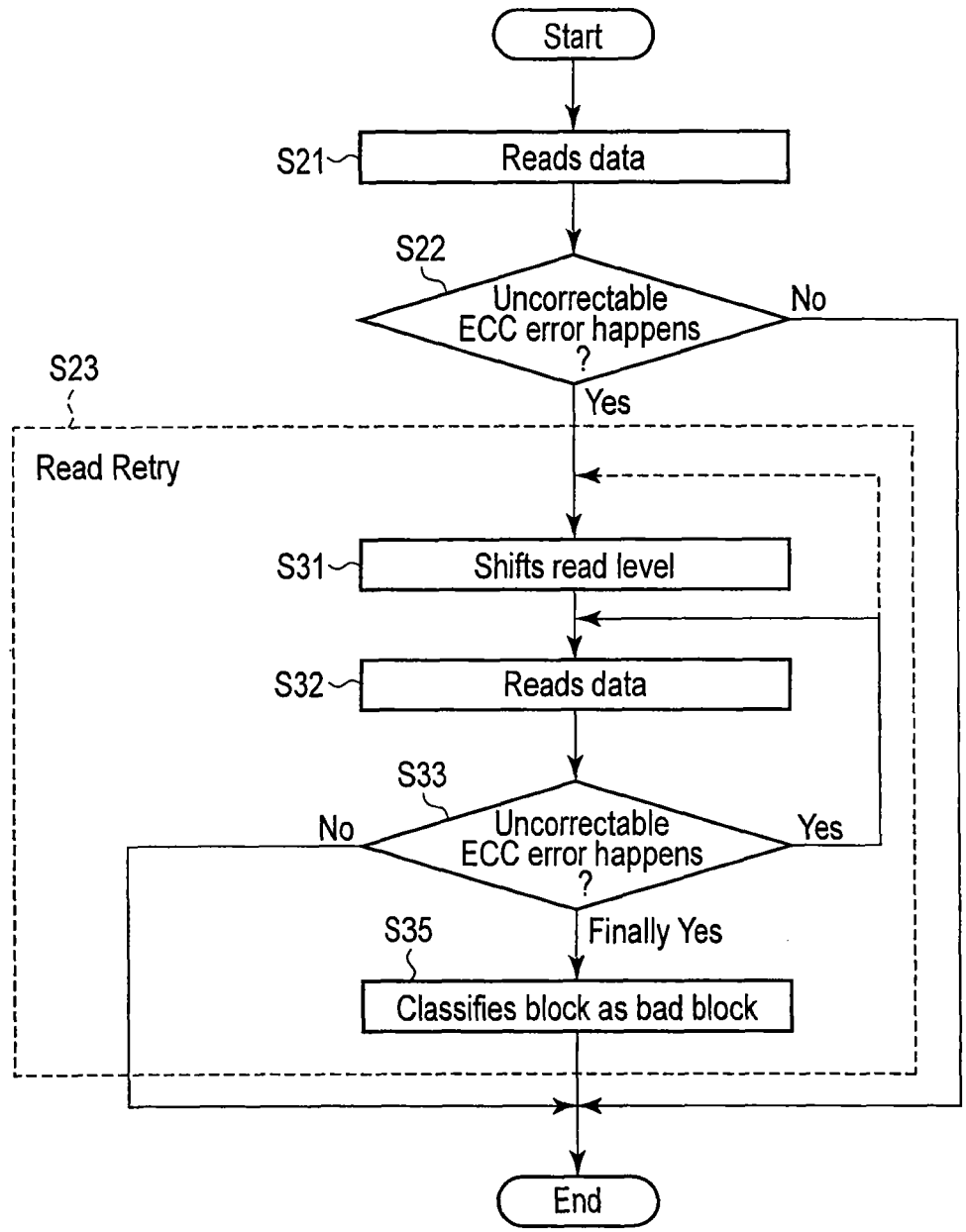
F I G. 30

SEMICONDUCTOR STORAGE DEVICE, METHOD FOR CONTROLLING THE SAME AND CONTROL PROGRAM

CROSS-REFERENCE TO RELATED APPLICATIONS

The present continuation application claims the benefit of priority under 35 U.S.C. 120 to application Ser. No. 13/713,442, filed on Dec. 13, 2012, and claims the benefit of priority under 35 U.S.C. 119 from Japanese Patent Application No. 2011-275866, filed Dec. 16, 2011, the entire contents both of which are incorporated herein by reference.

FIELD

Embodiments described herein relate generally to semiconductor storage devices, methods for controlling the same, and control programs.

BACKGROUND

Storage devices including a semiconductor memory and a controller for controlling the semiconductor memory are known. Such a storage device may be manufactured by preparing a manufactured semiconductor memory and assembling it with a controller. It is generally desirable, as regards a method to evaluate manufactured storage devices, to detect not only defects during the evaluation but also suppress defective rates after shipment, because it is desirable to avoid potential defects likely to occur in the devices that have passed a certain evaluation method in the early stage after shipment as much as possible. For this reason, there is a need to detect, during an evaluation, potential defects which have gone undetected during certain other evaluations utilising other evaluation methods but which could become actual defects soon after the shipment.

BRIEF DESCRIPTION OF THE DRAWINGS

FIG. 1 schematically illustrates a block diagram of a semiconductor memory device according to a first embodiment.

FIG. 5 illustrates an example memory cell array according to the first embodiment.

FIG. 13 illustrates an example of the storage device controller during the autorun mode according to the first embodiment in detail.

FIG. 14 illustrates example connection during screening of the semiconductor memory device according to the first embodiment.

FIG. 20 illustrates an example connection of the semiconductor memory device according to the fourth embodiment with a tester.

FIG. 21 illustrates another example connection of a semiconductor memory device according to the fourth embodiment with the tester.

FIG. 24 schematically illustrates a block diagram of a semiconductor memory device according to a sixth embodiment.

FIG. 25 illustrates a flow during boot of the semiconductor memory device according to the sixth embodiment.

FIG. 28 illustrates a further example refresh requence according the first embodiment.

FIG. 29 illustrates a still further example refresh requence according the first embodiment.

FIG. 30 illustrates another example flow of read retry by the semiconductor memory device according to the first embodiment.

DETAILED DESCRIPTION

Figure 2:
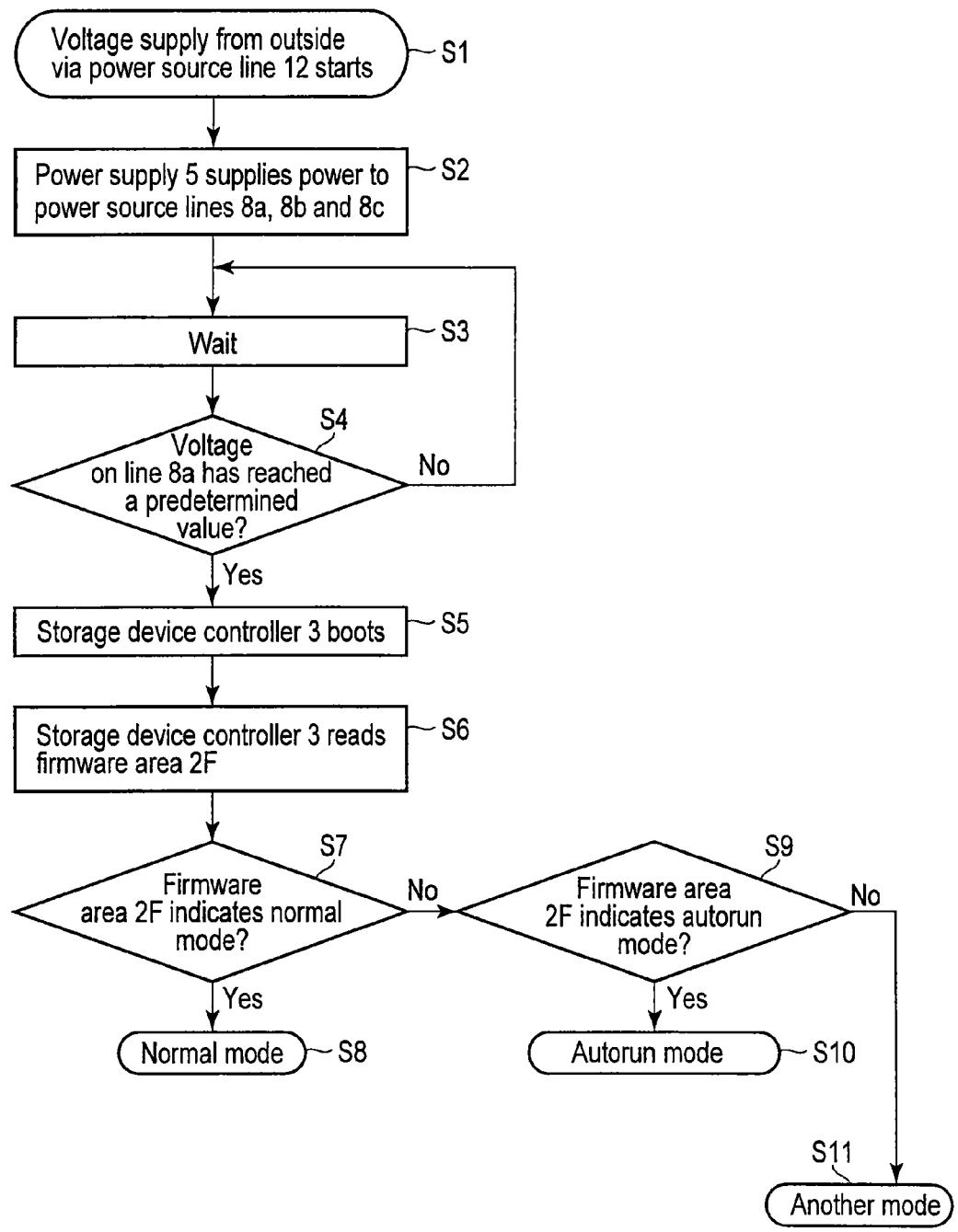
FIG. 2 illustrates a flowchart during boot of the semiconductor memory device according to the first embodiment.

In general, according to one embodiment, a semiconductor storage device comprises a semiconductor memory comprising blocks including memory cells and a memory controller. The semiconductor memory writes data in the memory cells, reads data from the memory cells, and erases data in the memory cells, and shifts a read level for data read in accordance with control by the memory controller. The semiconductor memory stores a program for causing the memory controller to operate in at least one of a first mode and a second mode. The memory controller writes substantial data and redundant data for correcting an error in the substantial data in the semiconductor memory. For example, the redundant data may be Cyclic Redundancy Check (CRC) code, Bose-Chaudhuri-Hocquenghem (BCH) code, Reed-Solomon (RS) code, Low-Density Parity-Check (LDPC) code and the like generated from the substantial data. The memory controller reads substantial data and corresponding redundant data from the semiconductor memory, and corrects an error in the read substantial data in accordance with the read redundant data. The memory controller reads the program to enter the first or second mode when power is supplied to the semiconductor storage device. In the first mode, for each of the blocks, the memory controller autonomously erases data, writes data, and reads the written data, and determines that the block or the semiconductor storage device is defective when a count of errors in the read data exceeds a correction capability or a threshold of the memory controller. In the second mode, when error correction of substantial data read from the semiconductor memory fails, the memory controller reads the substantial data which failed in the error correction using a read level shifted from the present read level.

Embodiments will now be described with reference to drawings. Components with substantially the same functions and configurations will be referred to with the same reference number and repetitive descriptions will be given only when required. Note that figures are schematic. Embodiments only illustrate devices and/or methods to realize the technical idea of the embodiments, and do not limit the various features of the components illustrated to the following and may be variously changed in accordance with the scope of the claims.

Each functional block may be implemented as hardware, computer software, or a combination of both. In order to clearly illustrate such interchangeability of hardware and software, descriptions will be generally given in terms of their functionality. Whether such functionality is implemented as hardware or software depends on a particular application and design constraints imposed on the overall system. Those skilled in the art may implement the functional blocks in varying ways suitable for each particular application, but any implementation approach is included in the scope of the embodiments.

Furthermore, it is not essential that the functional blocks are distinguished from one another as described below in specific examples. For example, some of the functions may be performed by functional blocks different from those illustrated below. Moreover, an illustrated functional block may be divided into functional sub-blocks. The embodiments are not limited by the specification of the particular functional blocks.

(First Embodiment)

FIG. 1 schematically illustrates a block diagram of a semiconductor memory device according to the first embodiment. The semiconductor storage device 1 is a solid state device (SSD), for example. The semiconductor storage device 1 is configured to be able to communicate with a host device 10. The semiconductor storage device 1 includes a memory (semiconductor memory) 2, a storage device controller 3, an interface controller 4, and a power supply 5. The memory 2 is responsible for actually storing data, and includes one or more semiconductor memory chips. The memory 2 nonvolatilely stores data, and is a NAND flash memory, for example. The NAND flash memory writes (or programs) and reads data per page which consists of memory cells. Each page is assigned a unique physical address. The NAND flash memory erases data per physical block (or erase block), which consists of pages. The details of the memory 2 will be described later.

A memory space formed by the memory 2 includes a firmware (or, control program, or commands) area 2F, a management information area 2M, and a user data area 2U. The firmware area 2 stores firmware to control operation of the storage device controller 3. The management information area 2M stores various management information used by the storage device controller 3 to control the semiconductor storage device 1. Users of the semiconductor memory device can store data in the user data area 2U through the host device 10.

The storage device controller 3 manages the whole semiconductor storage device 1, and in particular the operation of the memory 2. The storage device controller 3 consists of or includes a semiconductor chip, and includes a central processing unit (CPU), a read only memory (ROM), and a random access memory (RAM), for example. The RAM is a dynamic RAM (DRAM), a static RAM (SRAM), a magnetoresistive RAM (MRAM), a ferroelectric RAM (FeRAM), or a resistance RAM (ReRAM), for example. The firmware stored in the firmware area 2F is loaded on the RAM when the semiconductor storage device 1 is supplied with power. The CPU then performs predetermined processes in accordance with the firmware on the RAM. The storage device controller 3 operates in one of the operation modes, which will be described later, and manages the data storage state of the memory 2. The data storage state management includes management on which physical address page or block stores logical address data, and which physical address page or block is erased, i.e., stores no or invalid data. The storage state is managed with a logical address (Logical Block Address, or LBA) and physical address translation table (e.g., a logical-physical translation table or a lookup table(LUT)), for example. The logical-physical translation table is stored, for example, in the management information area 2M in the memory 2 upon cutoff of the power supply to the semiconductor storage device 1, and is loaded to the RAM in the storage device controller 3 upon boot of the semiconductor storage device 1.

The interface controller 4 implements an interface between the host device 10 and semiconductor storage device 1, and includes hardware and software for this purpose. The semiconductor storage device 1 communicates with the host device 10 via the interface controller 4. The interface controller 4 is communicatively coupled to the host device 10 via the interface 11. The interface controller 4 performs processes for communication between the semiconductor storage device 1 and host device 10 via the interface 11. The interface 11 also includes hardware features for the semiconductor storage device 1 to be physically coupled with the host device 10, for example, an array of pins, and the number of pins. The interface 11 may be a serial advanced technology attachment (SATA), PCI express, serial attached SCSI (SAS), universal serial bus (USE); however it is not limited to these examples. In the following description, the interface 11 is the SATA as an example. The interface controller 4, memory 2, and storage device controller 3 are communicatively coupled to each other via the bus 7.

The power supply 5 receives power from a device coupled to the power supply 5. While the semiconductor memory device 1 is coupled to the host device 10, the power supply 5 is coupled to the host device 10 via a power source line 12, with which it receives the power from the host device 10. The power supply 5 supplies power to the storage device controller 3, memory 2, and interface controller 4 via the power source lines 8a, 8b, and 8c, respectively.

Firmware will now be described in connection with boot of the semiconductor storage device 1. The firmware includes at least a normal mode and an autorun mode. The autorun mode is used during test, evaluation or inspection of the semiconductor storage device 1. The normal mode is used during normal use of the semiconductor storage device 1. The details of these modes will be described later.

The firmware can be rewritten. The rewriting can be executed by commands which comply with INCITS ACS-2 such as 92h DOWNLOAD MICROCODE and 93h DOWNLOAD MICROCODE DMA described in, for example, ATA/ATAPI Command Set-2 (ACS-2) d2015r6 Feb. 22, 2011 (see http://www.t13.org/Documents/UploadedDocuments/docs2011/d 2015r6-ATAATAPI_Command_Set_-_2_ACS-2.pdf). The rewriting may be executed by 11h Firmware Image Download command in NVM Express Revision 1.1 Oct. 11, 2012 (see http://www.nvmexpress.org/). Alternatively, the rewriting can be executed by SCT commands complying with INCITS ACS-2 or other vendor specific commands.

In particular, the firmware for the autorun mode is written in the firmware area 2F during the evaluation of the semiconductor storage device 1. The firmware area 2F may comprise of a normal firmware area and an autorun firmware area, only the autorun firmware area may be rewritten when the firmware for the autorun mode is downloaded from a tester device (for example, the host device 10), and the autorun firmware area may be erased before shipment. The firmware for the autorun mode is rewritten by the firmware for normal mode upon shipment after the evaluation of the semiconductor storage device 1. Alternatively, the firmware may include normal and autorun modes from the evaluation even after the shipment, and they may be switched with a command. Specifically, the INCITS ACS-2 complying SCT command or other vendor specific commands may be used to rewrite a trigger which is nonvolatilely stored in the firmware to switch between the normal and autorun mode. The switching of the modes will be described later in connection with other embodiments in detail. The firmware may also be rewritten by downloading it via the universal asynchronous receiver transmitter (UART) interface 101 as will be described later.

FIG. 2 illustrates a flowchart during boot of the semiconductor storage device 1 according to the first embodiment. The firmware causes the storage device controller 3 to execute the flow shown in FIG. 2 during the boot of the semiconductor storage device 1. The storage device controller 3 is configured to execute the flow shown in FIG. 2 in accordance with the firmware. As shown in FIG. 2, voltage supply to the semiconductor storage device 1 from outside the semiconductor storage device 1 (for example, the host device 10) via the power source line 12 starts (step S1). The supplied voltage is received by the power supply 5. The power supply 5 supplies, based on the received voltage, the storage device controller 3, memory 2, and interface controller 4 with predetermined voltages required for these components via the power source lines 8a, 8b, and 8c (step S2). The storage device controller 3 waits for a predetermined period (step S3), and determines whether the voltage on the power source line 8a has reached a value required for operation of the storage device controller 3 (step S4). When the determination in step S4 is No, the flow returns to step S3. When the determination in step S4 is Yes, the storage device controller 3 boots (step S5). The storage device controller 3 then loads the firmware in the firmware area 2F of the memory 2 onto the RAM in the storage device controller 3 (step S6). The storage device controller 3 determines whether the loaded firmware is for or specifies the normal mode (step S7). When the determination in step S7 is Yes, the storage device controller 3 enters the normal mode, and operates in the normal mode (step S8). In contrast, when the determination in step S7 is No, the storage device controller 3 determines whether the firmware is for or specifies the autorun mode (step S9). When the determination in step S9 is Yes, the storage device controller 3 enters the autorun mode, and operates in the autorun mode (step S10). When the determination in step S9 is No, the storage device controller 3 enters another mode, and operates in the mode (step S11). When the determination in step S7 is No, the storage device controller 3 may enter the autorun mode without step S9.

Figure 3:
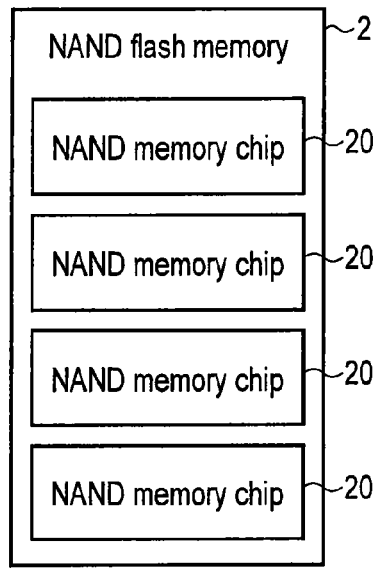
FIG. 3 illustrates an example memory according to the first embodiment.
Figure 4:
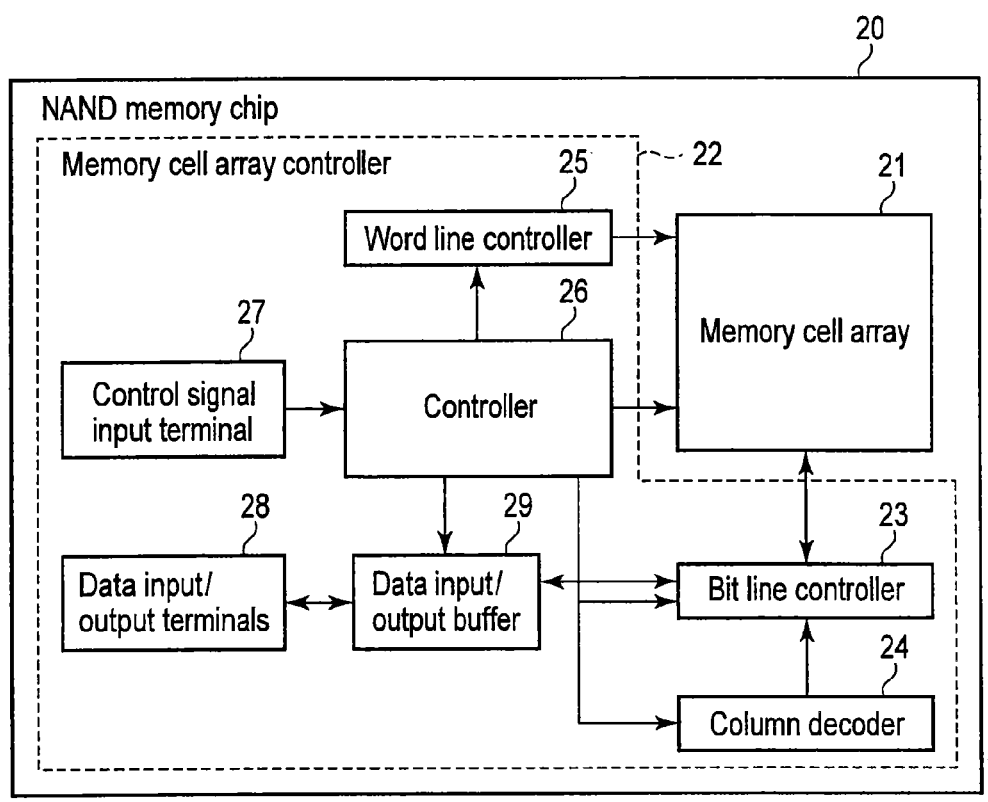
FIG. 4 illustrates an example memory chip according to the first embodiment.

The memory 2 will now be described. The memory 2 includes memory chips 20, for example, as shown in FIG. 3. FIG. 3 illustrates an example of the memory according to the first embodiment. As described above, the memory chip 20 is a NAND flash memory chip (NAND memory chip), for example. Each memory chip 20 is configured to store and read data of one or more bits in one memory cell. Each memory chip 20 has the configuration shown in FIG. 4. FIG. 4 illustrates an example of the memory chip according to the first embodiment. As shown in FIG. 4, the memory chip 20 includes a memory cell array 21 and a memory cell array controller 22. The memory cell array 21 includes bit lines, word lines, a common source line, and memory cells. The memory cells are configured to be electrically rewritten and are arranged at intersections of the bit lines and word lines. The memory cell array 21 will be described later in detail. The memory cell array controller 22 includes a bit line controller 23, a column decoder 24, a word line controller 25, a controller 26, a control signal input terminal 27, data input/output terminals 28, and a data input/output buffer 29.

The bit line controller 23 reads data in the memory cells via the bit lines in accordance with control by the controller 26 and column decoder 24, applies control voltages to the memory cells via the bit lines to write or erase data in the memory cells. The bit line controller 23 is coupled to the column decoder 24, data input/output buffer 29, and data input/output terminals 28. The data read from the memory cells are output to the outside from the data input/output terminals 28 via the bit line controller 23 and data input/output buffer 29. The data input/output terminals 28 are coupled to the storage device controller 3. Write data input to the data input/output terminals 28 from the outside is input to the bit line controller 23 via the data input/output buffer 29 by the column decoder 24, and written into specified memory cells. The word line controller 25 applies various voltages for data read, write, or erase to specific word lines in accordance with control by the controller 26. The controller 26 receives control signals input to the control signal input terminal 28. The control signal input terminal 27 is coupled to the storage device controller 3. Following the received control signals, the controller 25 generates control signals and control voltages to control the memory cell array 21, bit line controller 23, column decoder 24, data input/output buffer 29, and word line controller 25.

Figure 6:
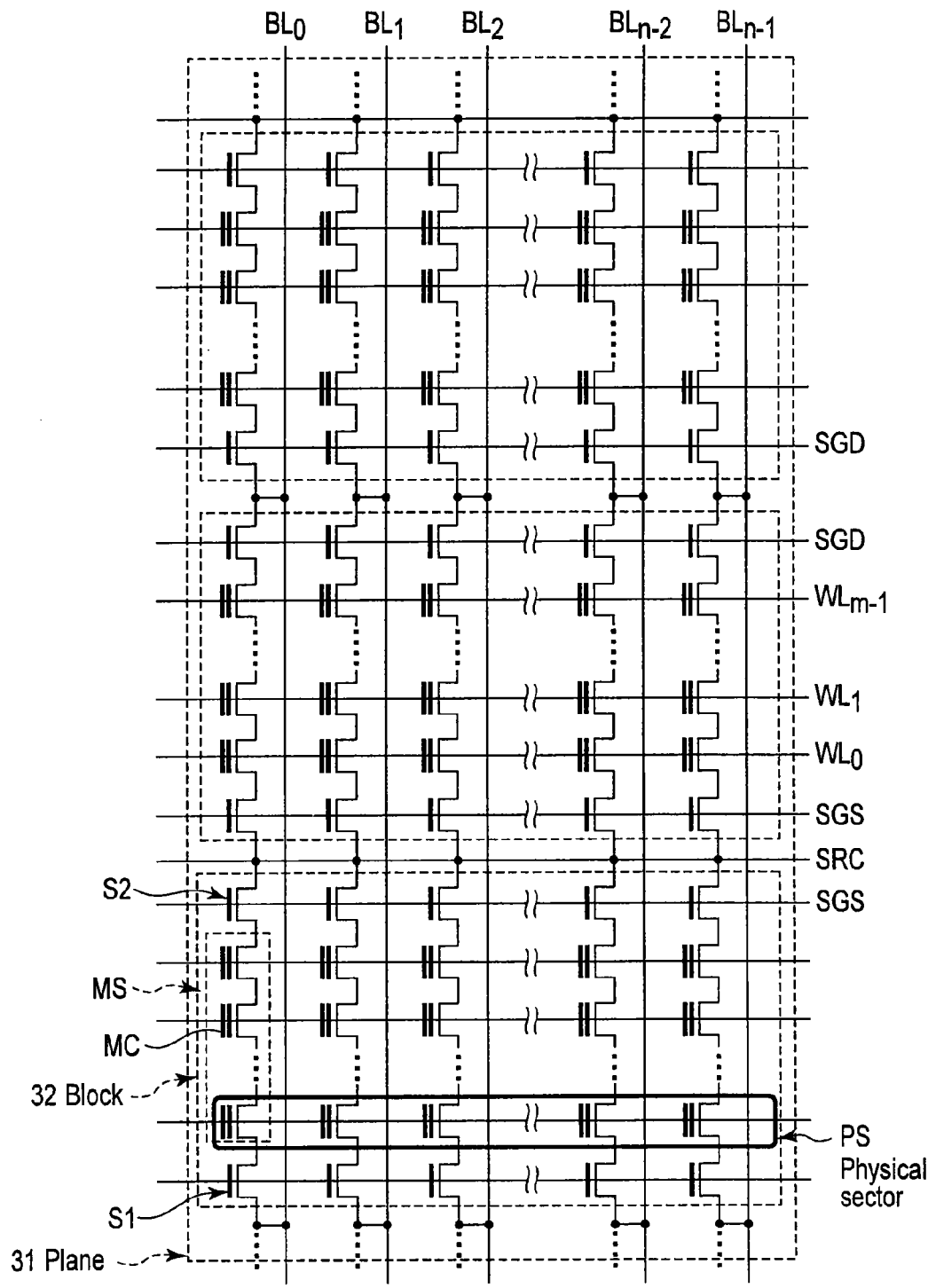
FIG. 6 illustrates an example plane according to the first embodiment.

FIG. 5 illustrates an example of the memory cell array 21 according to the first embodiment. As shown in FIG. 5, the memory cell array 21 includes one or more planes 31. Each plane 31 includes blocks 32. Each block 32 includes NAND cells, and data is erased per block. As shown in FIG. 6, each NAND cell includes a memory string MS which consists of serially-coupled memory cell transistors MC, and first and second select gate transistors S1 and S2 coupled to the both ends thereof. FIG. 6 illustrates an example of a plane according to the first embodiment. First select gate transistors S1 are coupled to respective bit lines BL, and second select gate transistors S2 are coupled to the source line SRC. Control gates of respective memory cell transistors MC in the same row are commonly coupled to one of word lines WL0 to WLm-1. The first select gate transistors S1 are commonly coupled to a select line SGD, and second select gate transistors S2 are commonly coupled to a select line SGS.

Each memory cell transistor MC includes a metal oxide semiconductor field effect transistor (MOSFET) with a stacked gate structure formed on a semiconductor substrate. The stacked gate structure includes a gate insulator on the semiconductor substrate, a charge storage layer (or floating gate electrode) on the gate insulator, an inter-gate insulator on the charge storage layer, and a control gate electrode on the inter-gate insulator. Each memory cell transistor MC has a threshold voltage which is varied in accordance with the number of the electrons stored in its floating gate electrode, and uses the difference in its threshold voltage to store data. As described above, the memory 2 can store data of one or more bits in one memory cell. The following description describes a four-level data storage method, or two-bit per cell storage, as an example. With this method, two pages (i.e., an upper page and a lower page) are assigned to a set of memory cell transistors MC coupled to the same word line WL. It is also possible to use a two-level data storage method (or one-bit per cell storage), eight-level data storage method (or three-bit per cell storage), or four-or-more-bit per cell storage method. The first embodiment is not limited by the number of bits per cell. The binary data storage method of one bit per cell assigns one page to each memory cell transistor MC. With the eight-level data storage method of three-bits per cell, each memory cell transistor MC uses upper, middle, and lower pages.

The memory cell transistors MC are not limited to the structure with the floating gate electrode. For example, a memory cell transistor may have a structure to trap the electrons in the interface of its nitride as the charge storage layer in order to vary its threshold voltage. An example of such structure may include a metal oxide nitride oxide silicon (MONOS) memory cell transistor MC. The MONOS memory cell transistor application may also be configured to store one-bit per cell or two-or-more bits per cell. The memory 2 may also have a structure with three-dimensionally arranged memory cells (for example, a BiCS memory) such as those described in U.S. Pat. No. 8,189,391, U.S. Publication No. 2010/0207195, and U.S. Publication No. 2010/0254191.

Memory cell transistors MC coupled to one word line WL configure one physical sector. Data is written in and read per physical sector. One physical sector PS stores data for two pages when written in with two-bits per cell (or four levels). In contrast, one physical sector stores data for one page when written in with one-bit per cell (or two levels), or stores data for three pages when written in with three-bits per cell (eight levels).

During data read and write, and data write verification, a physical address received from the storage device controller 3 selects one word line WL to select one physical sector PS. Switching of the pages in this physical sector PS is executed by the physical addresses (for example, row addresses of row addresses and column addresses). The present embodiment assumes that the memory 2 uses the two-bits per cell write method, the storage device controller 3 operates as two pages (i.e., upper and lower pages) assigned to one physical sector PS, and the unique physical address is assigned to each of these pages.

Figure 7:
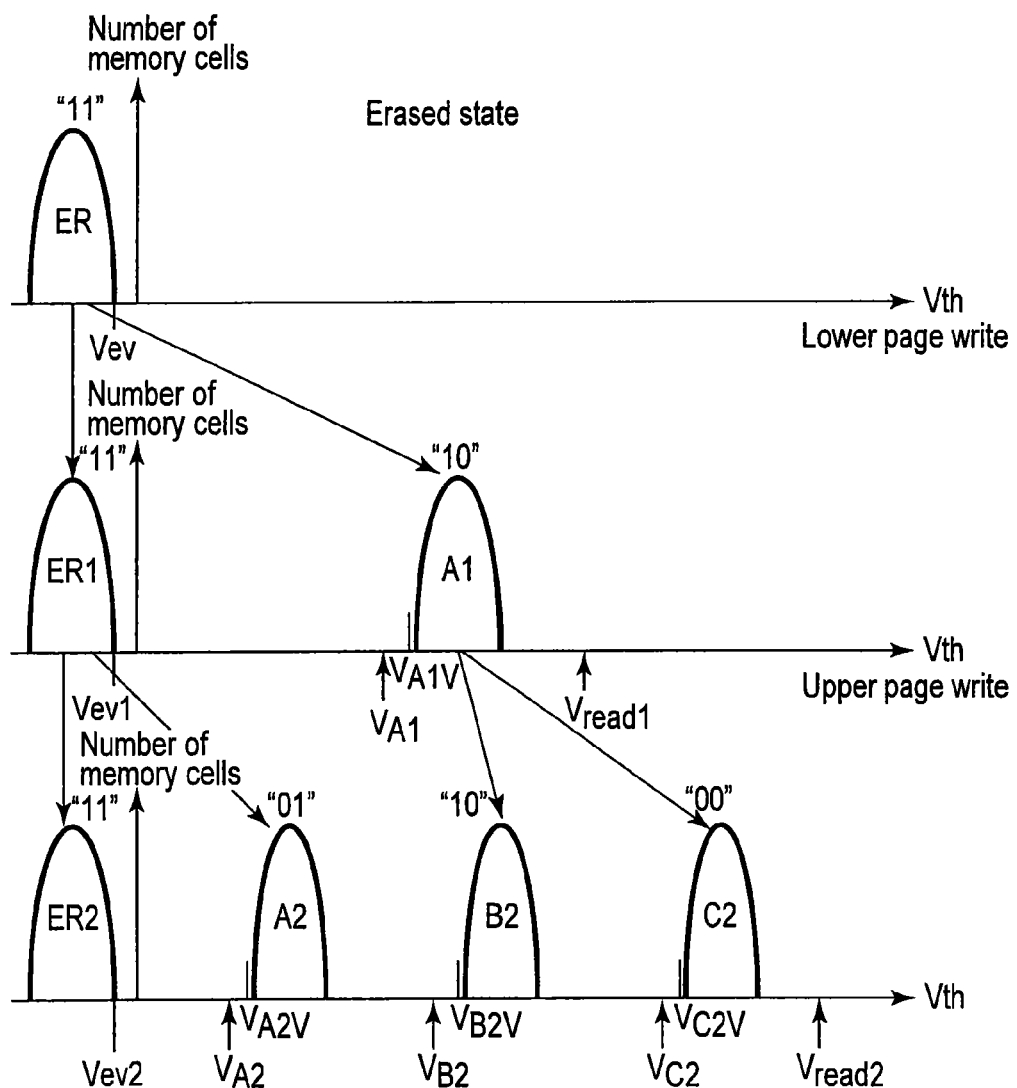
FIG. 7 illustrates an example relation of data in memory cells and threshold voltages according to the first embodiment.

FIG. 7 illustrates an example of a relation between data in memory cells and threshold voltage distribution according to the first embodiment. FIG. 7 relates to the four-level NAND memory of two-bits per cell. The four-level NAND memory is configured so that the threshold voltage in one memory cell can have one of four threshold voltages. The data assigned to the four threshold voltages may be data 11, 01, 10, and 00. In actuality, the variation in properties among the memory cells MC causes variation in the threshold voltages of memory cells MC intended to have the same values, which results in a particular distribution as shown in FIG. 7.

Voltage VA1 is applied to a selected word line to read two-level data from a physical sector with the written lower page and unwritten upper page. The voltage VA1V is a verification voltage applied to a memory cell in order to determine whether write has been completed during data write into the A1 state. Voltages VA2, VB2, and VC2 are applied to a selected word line to read four-level data from a physical sector with the written lower and upper pages. The voltages VA2V, VB2V, and VC2V are verification voltages applied to a memory cell in order to determine whether write has been completed during data write into A2, B2, and C2 states, respectively.

Voltages Vread1 and Vread2 are applied to unselected memory cells in the NAND cell during data read, and the read voltages to turn on the unselected memory cells irrespective of their stored data. The voltages Vev, Vev1, and Vev2 are erase verification voltages applied to a memory cell MC in order to determine whether erase has been completed during data erase of the memory cells MC, and have a negative value. Their magnitudes are determined with influences of interference among adjacent memory cells considerd. The relation of the magnitudes of the above voltages is as follows:
Vev1<VA1<VA1V<Vread1; and
Vev2<VA2<VA2V<VB2<VB2V<VC2<VC2V<Vread2.

The erase verification voltages Vev, Vev1, and Vev2 are negative as described above; however the voltages actually applied to the control gate of the memory cell MC in the erase verification are not negative but zero or positive. Specifically, in fact, a positive voltage is given to the back gate of the memory cell MC, and a zero voltage or positive one smaller than the back gate voltage is applied to the control gate of the memory cell MC. In other words, erase verification voltages Vev1, Vev2, and Vev3 are equivalent negative voltages.

Threshold voltage distribution ER of memory cells MC after data erase also has the negative upper limit and is assigned data 11. Memory cells with data 01, 10, and 00 with written lower and upper pages have positive threshold voltage distributions A2, B2, and C2, respectively, and also have positive upper limits. The threshold voltage distribution A2 of data 01 is the lowest, the threshold voltage distribution C2 of data 00 is the highest, and the relation among the threshold voltage distributions is A2<B2<C2. Memory cells of data 10 with the written lower page and unwritten upper page have positive threshold voltage distribution A1, which also have the positive lower limit.

The threshold voltage distribution shown in FIG. 7 is merely an example, and the first embodiment is not limited to this. For example, in FIG. 7, all threshold voltage distributions A2, B2, and C2 are in the positive voltage region; however the threshold voltage distribution A2 may be in the negative voltage region, and the threshold voltage distribution B2 and C2 may be in the positive voltage region. Threshold voltage distributions ER1 and ER2 may also be in the positive voltage region. Such distribution may be found in the BiCS memory. Moreover, in the above description the distributions ER2, A2, B2, and C2 are associated with the data 11, 01, 10, and 00, respectively; however other association is also possible. For example, the distributions ER2, A2, B2, and C2 may correspond to the data 11, 01, 00, and 10, respectively.

Two-bit data in one memory cell consists of lower page data and upper page data, which are written in that memory cell by separate writes, i.e. two writes. When data is labeled as "*@", "*" represents the upper page data and "@" the lower page data.

First, lower page data write will be described with reference to the first and second rows in FIG. 7. Assume that all memory cells to be written in have the erased state threshold voltage distribution ER, or store data 11. As shown in FIG. 7, after lower page data is written in, the threshold voltage distribution ER of the memory cells will be split into two threshold voltage distribution ER1 and A1 according to the written lower page data (1 or 0). When the lower page data is 1, the threshold voltage distribution ER of the erased state is maintained, and hence ER1=ER. ER1>ER may also be possible. When the lower page data is 0, a high electric field is applied to the tunnel oxide of the memory cells to inject the electrons into their floating gate electrodes to increase the threshold voltages Vth of the memory cells by a predetermined quantity. Specifically, write is repeated until the threshold voltages become greater than or equal to the verification voltage VA1V. As a result, the memory cells shifts to the written state (data 10). If the lowest threshold voltage does not become equal to or greater than the verification voltage VA1V (or if the number of memory cells with the threshold voltages below the verification voltage VA1V is greater than or equal to a threshold) after the write is repeated the predetermined number of times, the data write to the physical page of interest is determined to be an error ("program error" or "program fail").

Upper page data write will now be described with reference to the second and third rows in FIG. 7. The upper page data write is executed in accordance with write data (or upper page data) input from outside the memory chip 20, and the lower page data in the memory cells MC. Specifically, as shown in the second and third rows in FIG. 7, when the upper page data is 1, a high electric field is kept from being applied to the tunnel oxide of the memory cells MC to avoid increase of the threshold voltages Vth of the memory cells. As a result, memory cells having stored data 11 (or those which have had the threshold voltages in the distribution ER1) maintain the data 11 storing state (or ER2 state), and memory cells having stored data 10 (or those which have had the threshold voltages in the distribution A1) maintain the data 10 storing state (or B2 state). However, in order to secure voltage margin among distributions, it is desirable to use the positive verification voltage VB2V, which is larger than the verification voltage VA1V, to adjust the lower limit of the threshold voltage distribution to form threshold voltage distribution B2 with a narrowed width. If the lowest threshold voltage does not become greater than or equal to the verification voltage VB2V (or if the number of memory cells with the threshold voltages below the verification voltage VB2V is greater than or equal to a threshold) after the lower limit adjustment is repeated the predetermined number of times, the data write to the physical page of interest is determined to be an error ("program error" or "program fail").

In contrast, when the upper page data is 0, the high electric field is applied to the tunnel oxide of the memory cells to inject the electrons into their floating gate electrodes to increase the threshold voltages Vth of the memory cells by a predetermined quantity. Specifically, write is repeated until the threshold voltages become greater than or equal to the verification voltage VA2V or VC2V. As a result, memory cells having stored data 11 (or memory cells which have had threshold the voltages in the distribution ER1) acquire the data 01 storing state with threshold voltages in the distribution A2, and memory cells having stored the data 10 (or memory cells which have had the threshold voltages in the distribution A1) acquire the data 00 storing state with the threshold voltages in the distribution C2. The lower limits of the threshold voltage distributions A2 and C2 are also adjusted using the verification voltages VA2V and VC2V. If the lowest threshold voltage does not become greater than or equal to the verification voltage VA2V or VC2V (or if the number of memory cells with the threshold voltages below the verification voltage VA2V or VC2V is greater than or equal to a threshold) after the write is repeated the predetermined number of times, the data write to the physical page of interest is determined to be an error ("program error" or "program fail").

In data erase, erase is repeated until the threshold voltage becomes lower than or equal to the erase verification voltage Vev. As a result, the memory cells acquire the erased state (or the data 11 storing state). If the threshold voltages lower than or equal to the erase verification voltage Vev (or if the number of memory cells with the threshold voltages below the erase verification voltage Vev is greater than or equal to a threshold) after the erase is repeated the predetermined number of times, the erase to the physical page of interest is determined to be an error ("erase error" or "erase fail").

The description has been given for an example of data write with a typical four level storage method. The basic operation remains the same for the three-or-more bit storage method because splitting the threshold voltage distribution into eight or more sub-distributions in accordance with data in a further upper page is simply further added to the above operation.

Figure 8:
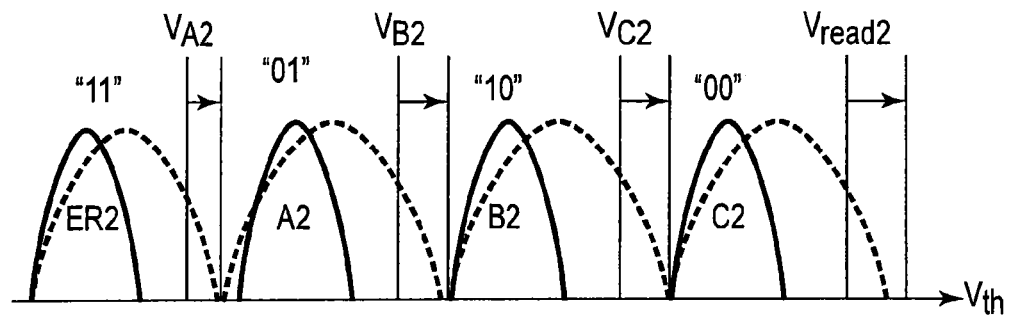
FIG. 8 illustrates variation in threshold voltage distribution due to program or read disturb, and read level shifts.
Figure 9:
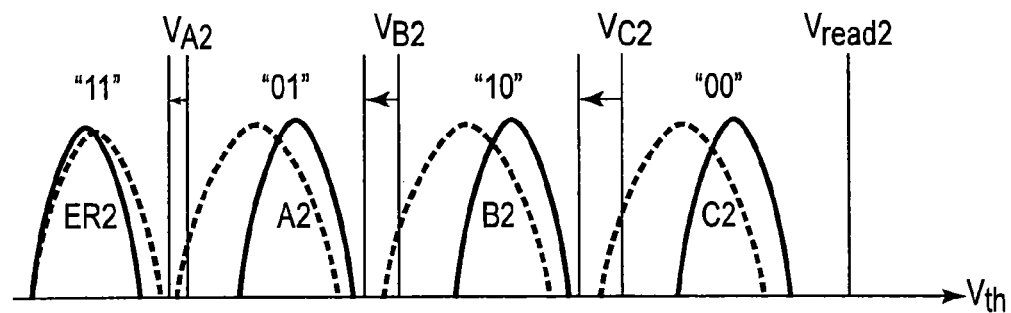
FIG. 9 illustrates variation in the threshold voltage distribution due to variation in data retention, and read level shifts.

Referring to FIGS. 8 and 9, data read will now be described. As described above, the semiconductor storage device 1 boots in the normal mode or autorun mode in accordance with, for example, whether the semiconductor storage device 1 is in a test stage (evaluation stage or inspection stage) or after shipment stage. The mode in which it starts depends on the firmware in the firmware area 2F. The following description describes data read in the normal mode. The threshold voltages corresponding to the data stored in memory cells MC vary due to a program disturb (PD), a read disturb (RD), and/or a deterioration of data retention (DR). The program disturb and read disturb refers to unintentional variations in the threshold voltages of memory cells resulting from the voltage applied to the memory cells during data write and read. The data retention may deteriorate by deterioration of data storage characteristics of the memory cells due to aging.

As shown in FIG. 8, the program and/or read disturb spread(s) and/or shift(s) the distributions of the threshold voltages of the memory cells MC toward the higher position as shown by the dashed lines. This results in the default read voltages (or levels) VA2, VB2, and VC2 to read respective threshold voltages and read voltage Vread2 applied to unselected cells (or the voltage VA1 and Vread1 for only-lower-page-written case, respectively) lower than the corresponding varied threshold voltages, which prevents correct data read. The program disturb influences on memory cells are described in U.S. Pat. No. 7,613,048, for example. The read disturb influences on memory cells are described in U.S. Pat. No. 7,099,190 and U.S. Pat. No. 7,453,728, for example.

In contrast, as shown in FIG. 9, deteriorated data retention of memory cells MC spreads and/or shifts the distribution of the threshold voltages of the memory cells MC to the lower position as shown by the dashed lines. This results in the default read levels VA2, VB2, and VC2 to read respective threshold voltages higher than the corresponding varied threshold voltages, which disables correct data read. The data retention properties of memory cells are disclosed by U.S. Pat. No. 8,000,927, for example.

The phenomena of the program disturb, read disturb, and data retention deterioration also occur to the single-level cell (SLC) case to store two-level data as well as the multi-level cell (MLC) case to store three-or-more level data as shown in FIGS. 8 and 9. On the other hand, since the MLC is subjected to stricter margin restrictions among threshold distributions then the SLC, it suffers more severely from the influences of the program disturb, read disturb, and data retention deterioration than the SLC.

To address the above phenomena, an operation referred to as so-called read retry (or shift read) may be executed. During data read, error correction with error correction code (ECC) is attempted for the first read. When there are too many error bits and hence the errors cannot be corrected (ECC error), the read retry is executed to correct the errors with the ECC again. Such data read can improve the defective rate as a system. The details are as follows.

Figure 10:
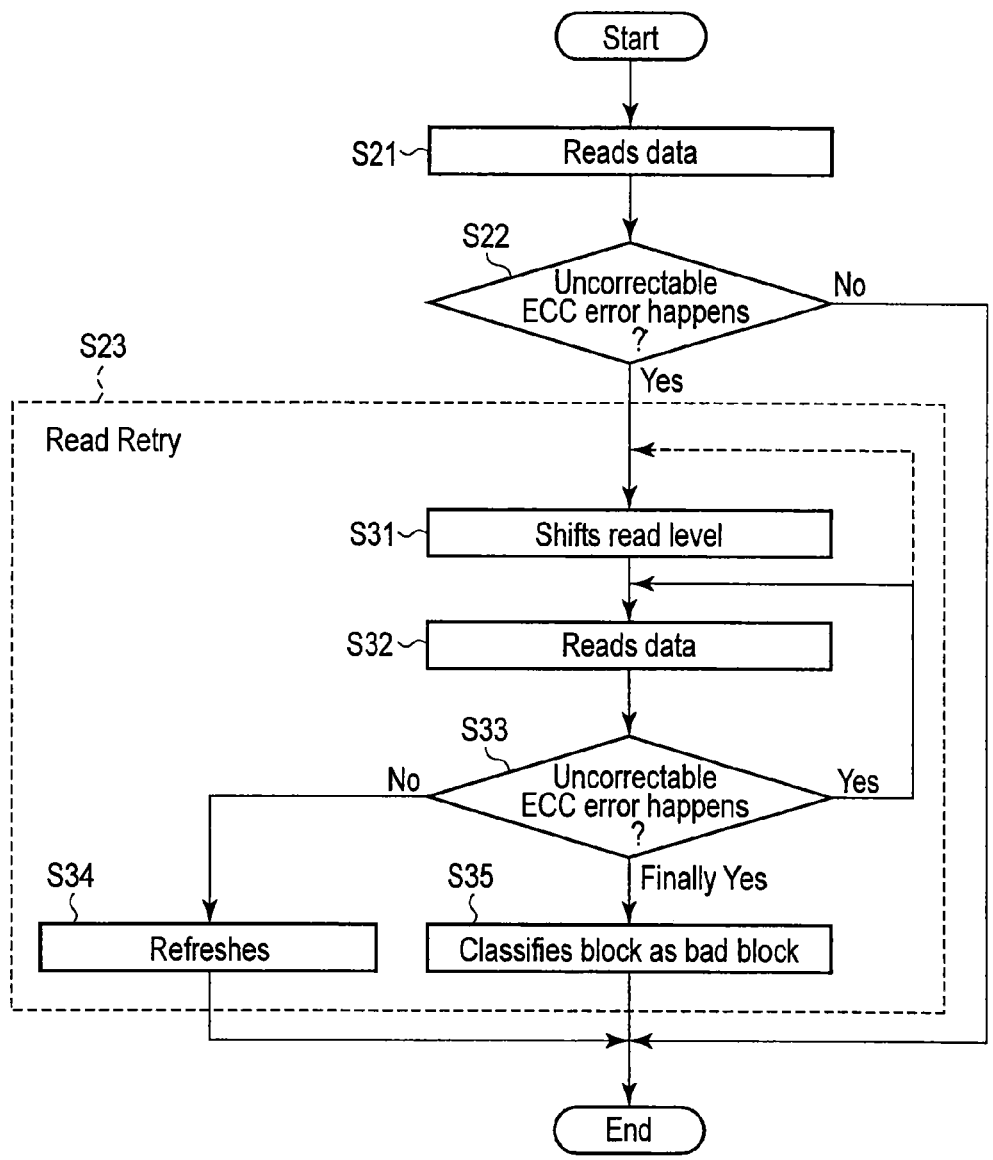
FIG. 10 illustrates an example flow of read retry by the semiconductor memory device according to the first embodiment.

FIG. 10 illustrates an example of a flow of the read retry by the semiconductor memory device according to the first embodiment. The normal mode firmware causes the storage device controller 3 to execute the flow shown in FIG. 10. The storage device controller 3 is configured to execute the flow shown in FIG. 10 in accordance with this firmware.

As shown in FIG. 10, the storage device controller 3 receives a data read instruction and an address or addresses of the memory cells to be read to start the data read. In actuality, the storage device controller 3 uses the logical-physical translation table to convert a logical address specifying the read target data into the corresponding physical address, and supplies the converted physical address to the memory 2.

First, the storage device controller 3 controls the memory 2 to read the data from the specified memory cells MC using, for example, the default read level (step S21). The storage device controller 3 corrects errors in the read data using the ECC, and determines whether the errors can be corrected (step S22). When there are few error bits and hence the errors can be corrected using the ECC, the storage device controller 3 outputs the read data to the host device 10. Thus, the data read concludes. In contrast, when the errors cannot be corrected in step S22 (S22:Yes) (Uncorrectable ECC Error), the storage device controller 3 executes the read retry (step S23). The read retry involves steps S31 to S35.

In step S31, the storage device controller 3 shifts the read level VA1, VA2, VB2 and VC2 used by the memory 2 from the default value. The storage device controller 3 controls the memory 2 to read the data from the memory cells MC using the shifted read level (step S32). The memory cells are the same as those read in the data read in step S21. As in step S22, the storage device controller 3 corrects errors in the read data using the ECC, and determines whether the errors cannot be corrected (step S33). When the errors can be corrected, the storage device controller 3 may refresh the read-target memory cells MC (step S34).

Figure 26:
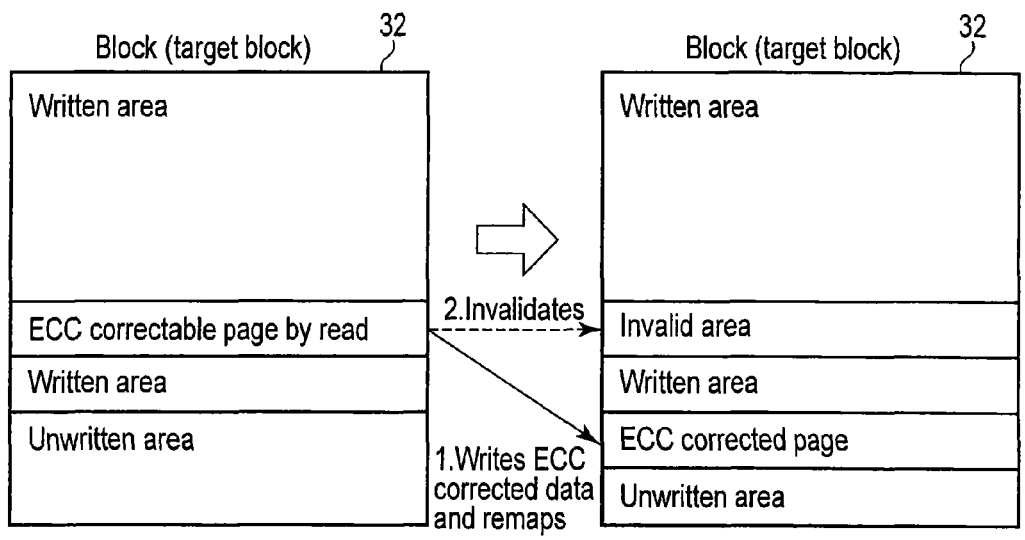
FIG. 26 illustrates an example refresh requence according the first embodiment.

FIG. 26 shows an example of the refresh requence according to the first embodiment. In this example, the storage device controller programs corrected data which is read from a block during the read retry sequence S23 into an unwritten area in the same block. The Storage device controller 3 rewrites the management information area 2M so that the LBA which the uncorrected data (or old data) is mapped to is remapped to the corrected data properly and the old data is invalidated. As a result, the data reliability of the LBA is enhanced.

Figure 27:
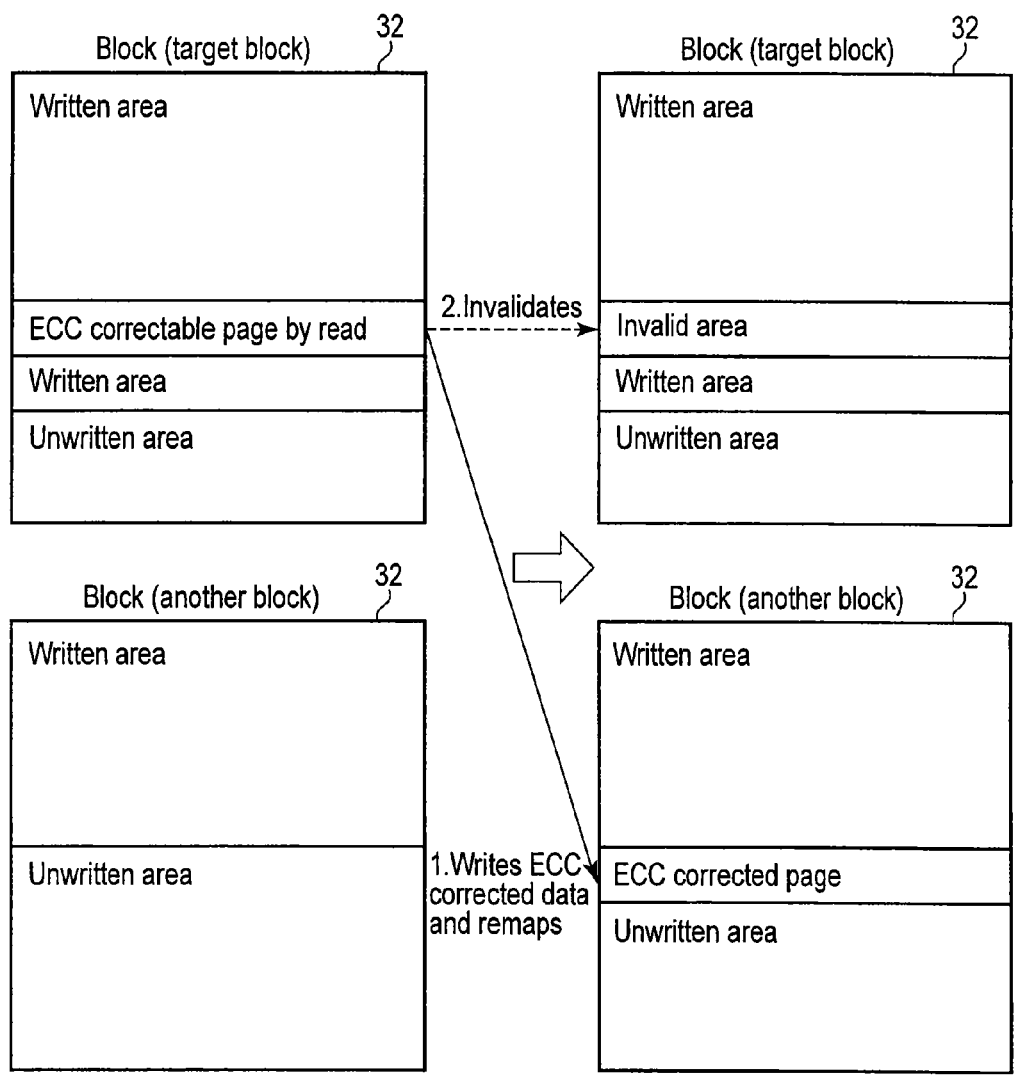
FIG. 27 illustrates another example refresh requence according the first embodiment.

FIG. 27 shows another example of the refresh requence according to the first embodiment. In this example, the storage device controller 3 programs corrected data which is read from a block during the read retry sequence S23 into an unwritten area in another block. The Storage device controller 3 rewrites the management information area 2M so that the LBA which the uncorrected data (or old data) is mapped to is remapped to the corrected data properly and the old data is invalidated. As a result, the data reliability of the LBA is enhanced.

FIG. 28 shows a further example of the refresh requence according to the first embodiment. In this example, the storage device controller 3 erases a free block and programs corrected data which is read from a block during the read retry sequence S23 into the free block. The Storage device controller 3 rewrites the management information area 2M so that the LBA which the uncorrected data (or old data) is mapped to is remapped to the corrected data properly and the old data is invalidated. As a result, the data reliability of the LBA is enhanced.

FIG. 29 shows a still further example of the refresh requence according to the first embodiment. In this example, the storage device controller 3 writes the corrected data which is read from a block (or old block) during the read retry sequence S23 into the RAM area in the storage device controller 3, reads and corrects the other written area in the block, and writes the corrected data into the RAM area. The storage device controller 3 erases a free block, programs all the corrected data from the old block to the free block, rewrites the management information area 2M so that the LBAs which all the corrected data read from the old block are mapped to are remapped to the corrected data properly and the old data is invalidated. As a result, the data reliability of the LBAs is enhanced.

In step S34, the storage device controller 3 also outputs the read data to the host device 10. Thus, data read concludes. As described in FIG. 30, the refresh sequence S34 may be skipped and the storage device controller 3 may output the read data to the host device 10 without the refresh sequence S34.

In contrast, when the errors cannot be corrected in step S33, step S32 is executed again. Alternatively, the set of steps S31 and S32 may be executed again. Specifically, the data may be read using a further-level-shifted read level. Step S33 also involves determination of whether the count of repeat of step S32 has reached a threshold. Specifically, when the storage device controller 3 determines that the repeat count of step S32 has reached the threshold, the flow shifts to step S35. In step S35, the storage device controller 3 registers the block (or page) including the read-target memory cells MC as a bad block (step S35). The information to specify bad blocks is stored in, for example, the memory 2, and bad blocks are not used to store data. Step S35 also involves outputting a status indicative of completion of the data read by the storage device controller 3 due to an error to outside the semiconductor storage device 1, such as to the host device 10.

Figure 11:
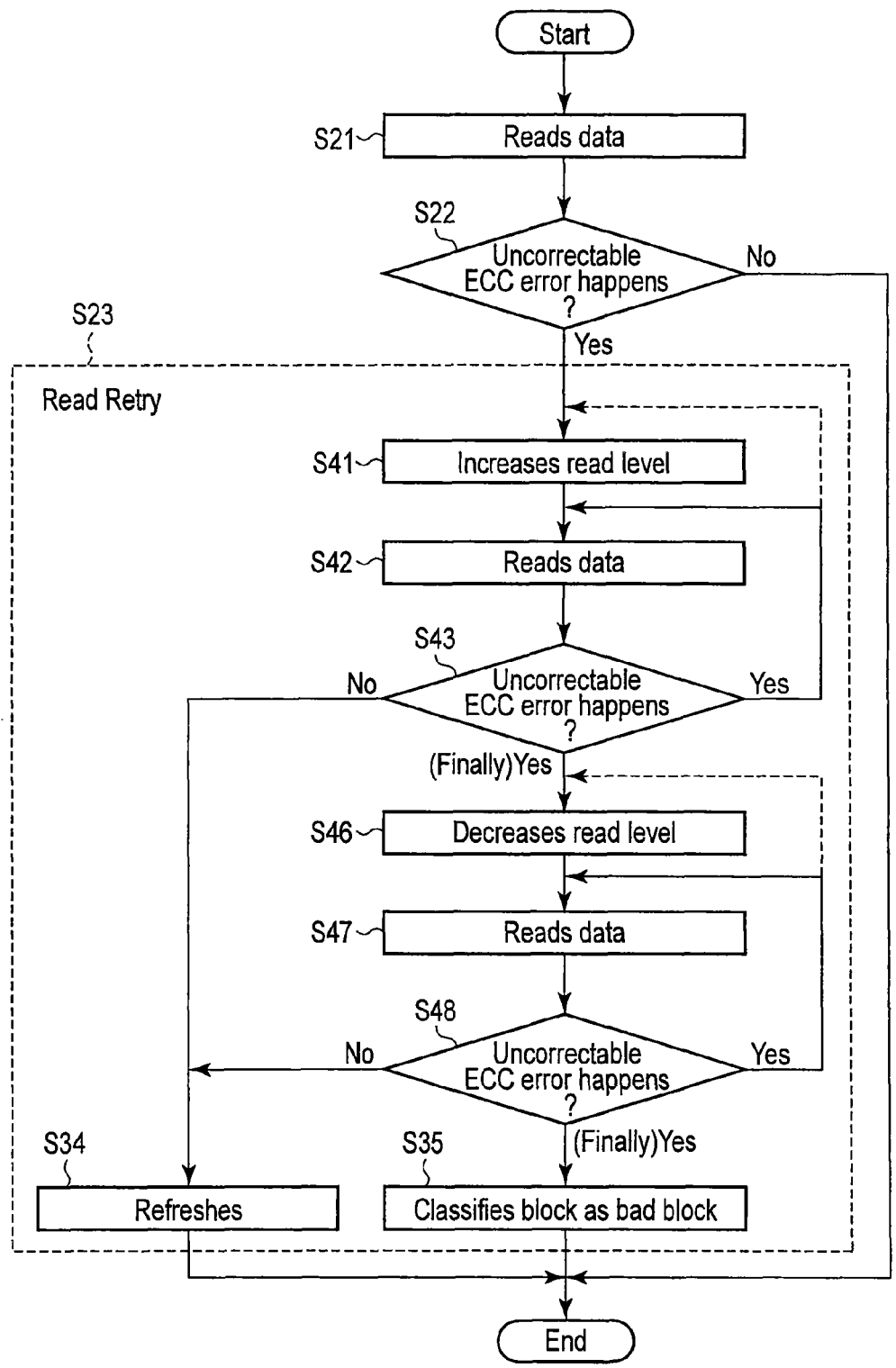
FIG. 11 illustrates another example flow of read retry by the semiconductor memory device according to the first embodiment.

FIG. 11 illustrates another example of a flow of the read retry by the semiconductor memory device according to the first embodiment. The read retry of FIG. 11 (step S23) involves steps S34, S35, and S41 to S48. In the read retry, the storage device controller 3 first shifts the read level used by the memory 2 from the default value in the positive direction (step S41). The storage device controller 3 controls the memory 2 to read the data from the memory cells MC using the shifted read level (step S42). As in step S22, the storage device controller 3 corrects errors in the read data using the ECC, and determines whether the errors cannot be corrected (step S43). When the errors can be corrected, the flow shifts to step S34.

In contrast, when the errors cannot be corrected in step S43, the storage device controller 3 shifts the read level from the default value in the negative direction (step S46). Alternatively, step S42 may be reexecuted after step S43 as in FIG. 10. Furthermore, step S42 may be reexecuted after the read level is further shifted in the positive direction in step S41. For a case of repeated read, when the count of repeat of step S42 has reached a thereshold in step S43, the flow shifts to step S46 as in FIG. 10.

The storage device controller 3 controls the memory 2 to read the data from the memory cells MC using the shifted read level (step S47). As in step S22, the storage device controller 3 corrects errors in the read data using the ECC, and determines whether the errors cannot be corrected (step S48). When the errors can be corrected, the flow shifts to step S34. When the errors cannot be corrected, the flow shifts to step S35. Alternatively, step S47 may be executed after step S48 as in FIG. 10. Furthermore, step S47 may be reexecuted after the read level is further shifted in the negative direction in step S46. For a case of repeated read, when the count of repeat of step S47 has reached a threshold in step S48, the flow shifts to step S46 as in FIG. 10.

In FIG. 11, the data is read after the read level is shifted in the positive direction, and then the data is read after the read level is shifted in the negative direction; however, the order of shifting may be reversed.

Figure 12:
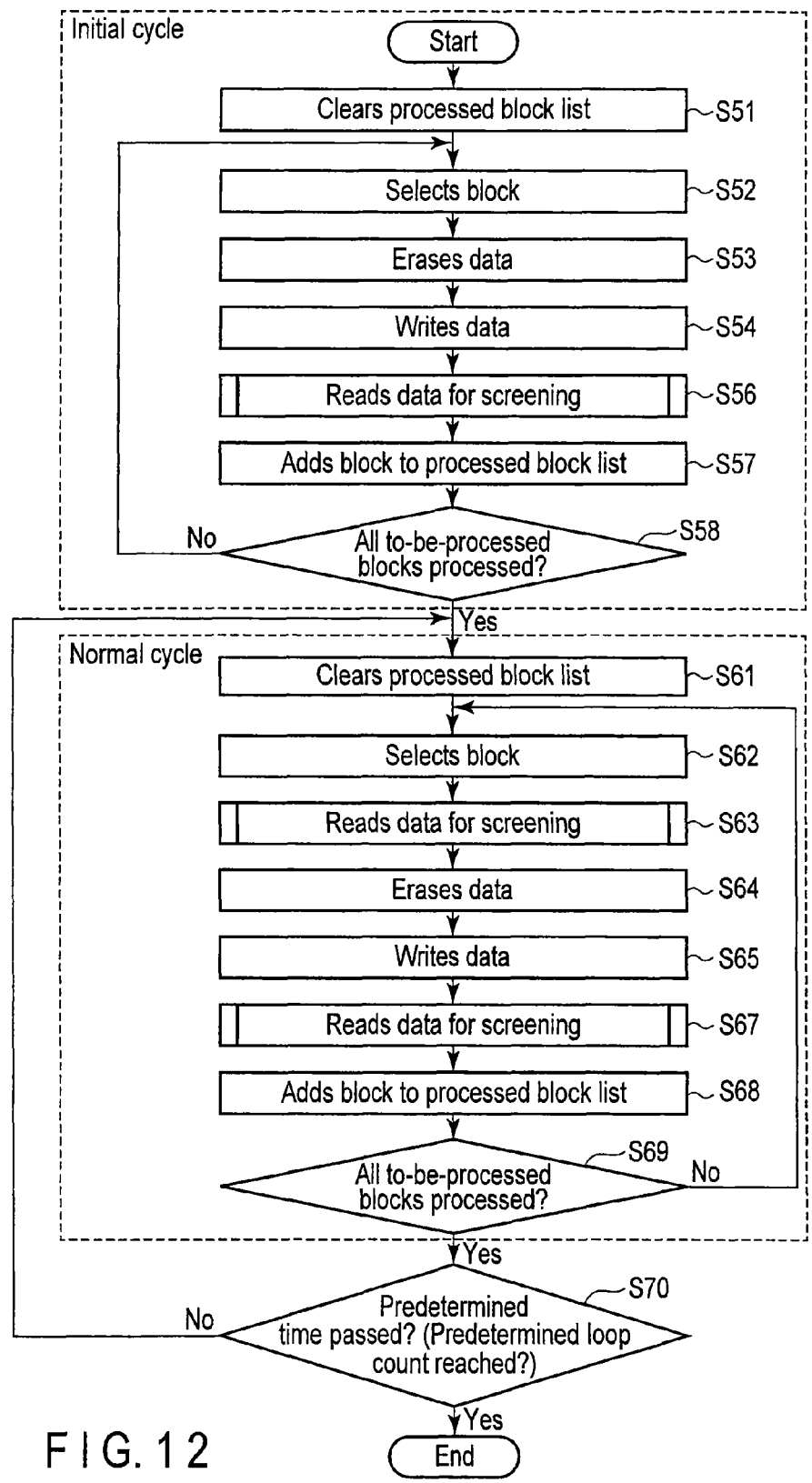
FIG. 12 illustrates an example flow of an autorun mode by the semiconductor memory device according to the first embodiment.

The autorun mode will now be described. While the semiconductor storage device 1 is, for example, in the test stage, the firmware for autorun mode is in the firmware area 2F of the memory 2. For this reason, the semiconductor storage device 1 enters the autorun mode with the start of the power supply to the semiconductor storage device 1. FIG. 12 illustrates an example of a flow of the autorun mode by the semiconductor storage device 1 according to the first embodiment. The autorun mode firmware causes the storage device controller 3 to execute the flow shown in FIG. 12. The storage device controller 3 is configured to execute the flow shown in FIG. 12 in accordance with the firmware.

The storage device controller 3 in the autorun mode has functional blocks shown, for example, in FIG. 13 to execute the flow of FIG. 12. The storage device controller 3 includes at least a memory controller 3a, an error correction unit 3b, and a screening controller 3c. The memory controller 3a controls data read, write, and erase in the memory 2. The error correction unit 3b generates error correction codes, and corrects errors. The memory controller 3a and error correction unit 3b follow control by the screening controller 3c during the screening. The memory controller 3a may be configured to vary the read levels. The memory controller 3a and error correction unit 3b may be common with those for the normal mode. In the normal mode, the memory controller 3a and error correction unit 3b follow control by a controller for the normal mode different from the screening controller 3c.

In the autorun mode, the storage device controller 3 autonomously executes a process referred to as a NAND screening (or simply screening). The screening involves repeat of data erase, data write, and data read for each block in order to age memories. Blocks determined to be defective in the process of aging are classified as bad blocks in order to keep them from being used. The determination as defective may be based on defective data erase or write, or infeasibility of ECC correction. Detecting bad blocks with the aging can improve the reliability of the semiconductor storage device 1. This is based on, for example, the phenomenon that blocks which become defective via some aging highly possibly become defective as a result of light use after the shipment even if they pass a test that does not include the aging. The test with the aging can classify such blocks as bad blocks to reduce initial failures. As shown in FIG. 12, the screening generally involves repeat of a set of block selection, data erase, data write, and data read. Steps S51 to S58 are for the first loop (an initial cycle), and steps S61 to S70 are for the second and further loops (a normal cycle).

As shown in FIG. 12, the screening controller 3 clears a list of processed blocks (step S51). The processed block list indicates whether the processes up to screening target blocks in the memory 2 have been completed, and may be created on a RAM in the storage device controller 3 in the autorun mode. All blocks in the user data area 2U of the memory 2 are screened, for example. One or both of the firmware area 2F and management information area 2M, or other area may also be screened. The screening controller 3 selects an unprocessed (or unchecked) block in accordance with the processed block list (step S52). The storage device controller 3 erases the data in the selected block, i.e., the data in all memory cells in that block (step S53).

The screening controller 3c writes specific data in all pages (including both the lower and upper pages) in the selected block. The data to be written in includes substantial data and redundant bits for error correction (or ECC) generated in accordance with that substantial data, and are generated by the screening controller 3c and error correction unit 3b. Preferably, the substantial data is random data in order to perform the aging and screening of the memory cells MC uniformly. More preferably, the substantial data is random data generated for every step or loop. For example, the redundant data may be Cyclic Redundancy Check (CRC) code, Bose-Chaudhuri-Hocquenghem (BCH) code, Reed-Solomon (RS) code, Low-Density Parity-Check (LDPC) code and the like generated from the substantial data.

The screening controller 3c reads data for the purpose of the screening via the memory controller 3a, and determines whether the currently-selected block is good or bad (step S56). Specifically, it reads the data from one page in the currently-selected block after another, and checks errors in the read data using the ECC. This sequence of processes is executed to all pages. For example, when errors in each page in the currently-selected block can be corrected, this block is determined to be good. When the selected block does not include a page including data with uncorrectable errors, this block is determined to be good. The data read for the purpose of the screening will be described in full detail later. Step S56 may only involve determination of feasibility of error correction without actual correction of errors in the read data.

When there is a block with uncorrectable ECC errors, the semiconductor memory devices 1 may be determined to be bad. In that case, when the errors cannot be corrected, the screening may be desirably terminated immediately and a light emitting diode (LED) may be rapidly blinked via the DAS/DSS signal line in the power source line 12, for example, in order to report outside that the screening has been abnormally terminated and the memory devices 1 is bad.

The screening controller 3c then adds the currently-selected block to the processed block list (step S57). The screening controller 3c refers to the processed block list to determine whether all to-be-processed blocks have been processed (step S58). With an unprocessed block, the flow returns to step S52, where the screening controller 3c selects another block. The block selection may be based on any rules. For example, block address=0 is selected for the first block selection, followed by selection of block address=1, i.e., the address is increased by one for every block selection. Thus, one block is selected after another. Alternatively, the screening controller 3c may create a block address list which includes block addresses arranged in rows in random order, and select block addresses along the rows.

Figure 31:
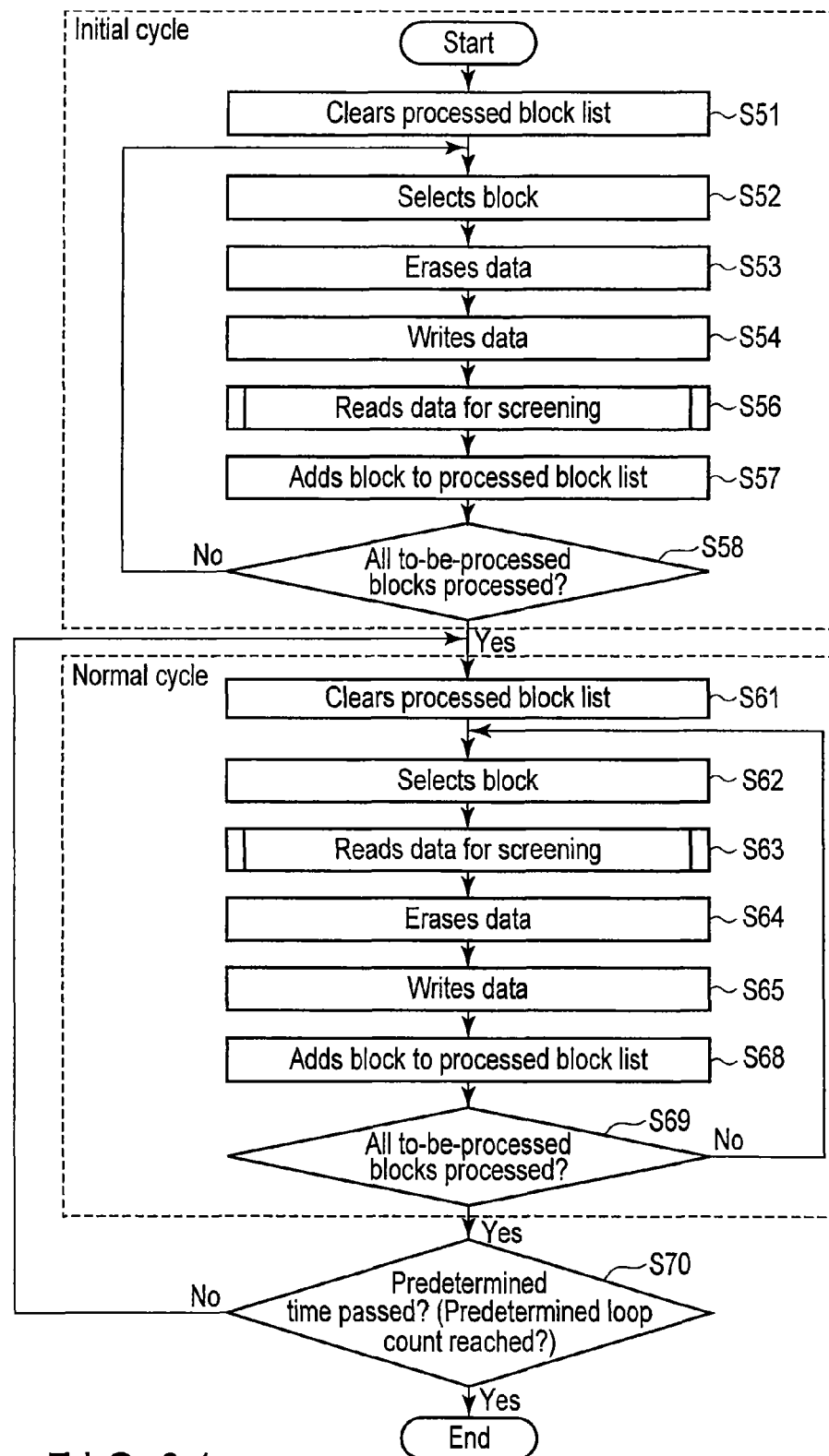
FIG. 31 illustrates another example flow of an autorun mode by the semiconductor memory device according to the first embodiment.

When all blocks have been processed in step S58, the first loop for all blocks concludes. The flow then shifts to step S61. Steps after step S61 are for the second and further loops for all to-be-processed blocks. Steps S61 and S62 are the same as steps S51 and S52 for the first loop, respectively. The screening controller 3c then executes data read for the purpose of the screening and determination of the block (step S63). Step S63 is the same as step S56. The screening controller 3c then performs steps S64, S65, S67, and S68. Steps S64, S65, S67, S68, and S69 are the same as steps S53, S54, S56, S57, and S58 of the first loop, respectively. When there is still an unprocessed block in step S69, the flow returns to step S61, and then shifts to step S70 after all blocks have been processed. As shown in FIG. 31, for example, step S67 in the normal cycle may be skipped because step S63 can detect errors which occur during step S67. Furthermore, step S56 in the initial cycle may be skipped because step S63 can detect errors which occur during step S56.

Steps S63 (pre-read) and S67 (post-read) may only involve the determination of the feasibility of error correction without actual correction of errors in the read data, or involve actual correction of errors in the read data.

When there is a block with uncorrectable errors, the semiconductor memory devices 1 may be determined to be bad. In that case, when errors cannot be corrected, the loop is desirably terminated to immediately end the screening and the LED is rapidly blinked via the DAS/DSS signal line in the power source line 12, for example, in order to report outside that the screening has been abnormally terminated and the memory devices 1 is bad.

In step S70, the screening controller 3c determines whether a predetermined time has passed from the start of step S51. When the predetermined time has not passed yet, the loop of steps S61 to S69 is repeated (i.e., the normal cycle is repeated). The predetermined time is determined in accordance with the number of loops determined in accordance with the desired degree of the aging in the screening. Alternatively, step S70 may involve comparison of the count of loop of steps S61 to S69 with a threshold. When the determination in step S70 is Yes, the screening concludes.

As described above, the first loop (or initial cycle) uses the block selection, data erase, data write, and data read as one set, whereas the second and further loops (normal cycles) use the data read (or pre-read), block selection, data erase, data write, and data read as one set. This can improve the reliability of the screening. Specifically, data may be accidentally written in a processed block in a particular loop through access to another block in that loop or a subsequent loop. Without the pre-read, such erroneous write cannot be detected because the process to the erroneously-written block in the subsequent loop would start from data erase. In contrast, the pre-read can detect an erroneously-written block. Alternatively, data may be accidentally erased in a processed block in a particular loop through access to another block in that loop or subsequent loop. Without the pre-read, such erroneous erase cannot be detected because the process to be performed on the erroneously-erased block in the subsequent loop would start from data erase. In contrast, the pre-read can detect such an erroneously-erased block. Alternatively, since there is an interval after data is written in a particular block before the data is erased, executing the pre-read to read the data again before erased can screen blocks with bad retention. Shifting from the block selection (step S62) to the erase (step S64) without the pre-read (step S63) can also provide the advantages of the first embodiment. It is, however, desirable to execute the pre-read (step S63) in order to improve detection of defects. The post-read S67 may be skipped as shown in FIG. 31 because the pre-read S63 can detect errors which occur during step S67.

In the pre-read, the screening controller 3c reads data from one particular page in a selected block after another, and corrects errors in the read data using the ECC. This series of processes is repeated to all pages. For example, when errors in data in pages in a selected block cannot be corrected, that block is determined to be bad and is added to bad blocks. When there is a block with uncorrectable errors, the storage devices 1 may be determined to be bad, and the screening may be terminated immediately.

Figure 15:
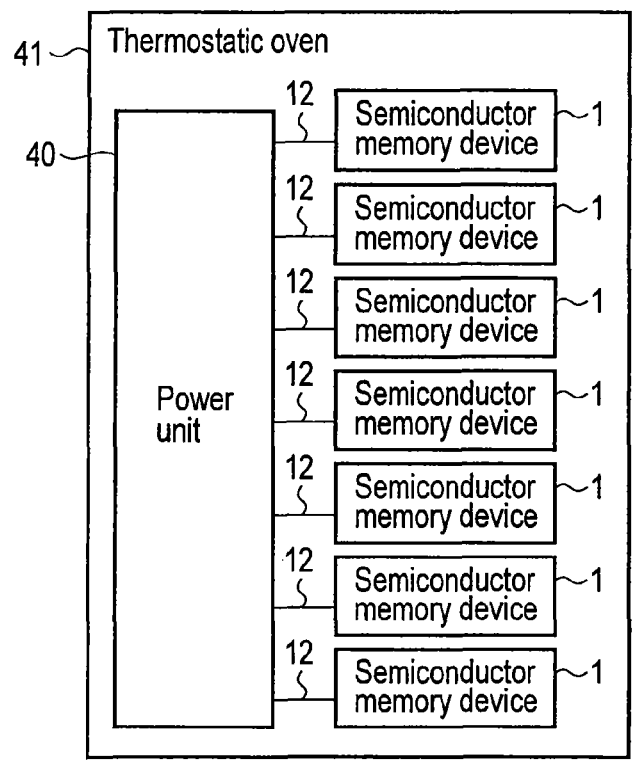
FIG. 15 illustrates other example connection during the screening of the semiconductor memory device according to a first embodiment.

The screening does not require the host device 10, and hence, during the screening the semiconductor storage device 1 only needs to be coupled to the power unit 40 in order to operate, and such connection is desirable. FIG. 14 illustrates an example of connection during the screening of the semiconductor storage device 1 according to the first embodiment. As shown in FIG. 14, the semiconductor storage device 1, in particular the power supply 5, receives power supply from the power unit 40 through the power source line 12. Errors and results may be reported to the power unit 40 via the power source line 12. For example, when the power source line 12 conforms to Serial ATA 2.6 standard, P11 DAS/DSS signal line can be used to report the errors and results. For example, when the power source line 12 conforms to SFF-8639 Specification Rev 1.5, P11 Activity/Spinup signal line can be used to report the errors and results. The screening can be executed on multiple semiconductor memory devices 1 simultaneously using one piece of equipment as shown in FIG. 15. This may reduce the cost and increase the throughput, and hence is desirable. FIG. 15 illustrates another example of connection during the screening of the semiconductor storage device 1 according to the first embodiment. As shown in FIG. 15, multiple semiconductor memory devices 1 are arranged in a thermostatic oven 41. Each semiconductor storage device 1 is coupled to the common power unit 40 via respective power source lines 12.

Figure 16:
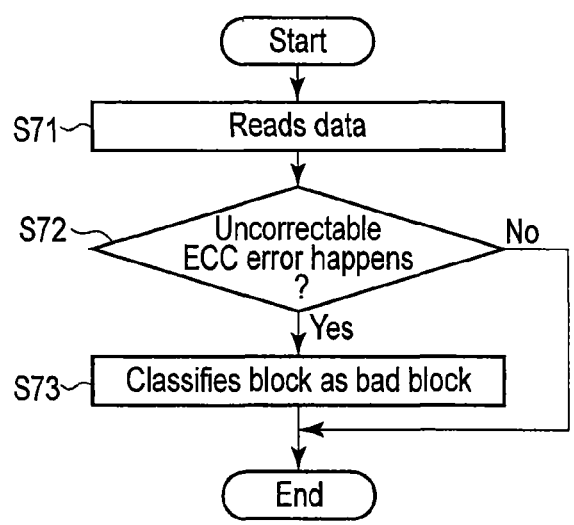
FIG. 16 illustrates a data read flow during the screening of the semiconductor memory device according to the first embodiment.

Referring to FIG. 16, data read for the purpose of screening steps S56, S63, and S67 of FIG. 12 will now be described. FIG. 16 illustrates a flow of the data read during the screening of the semiconductor memory device according to the first embodiment, and corresponds to details of step S56, S63, and S67. The autorun mode firmware causes the storage device controller 3, in particular the screening controller 3c, to execute the data read for the screening shown in FIG. 16. The storage device controller 3, in particular the screening controller 3c, is configured to execute the flow shown in FIG. 16 in accordance with the firmware.

As shown in FIG. 16, in step S71, the screening controller 3c reads data from one particular page in a selected block through the memory controller 3a after another (step S71), and checks errors in the read data using the ECC through the error correction unit 3b (step S72). The screening controller 3c also executes a series of processes of steps S71 and S72 to all pages in the selected block, and determines whether all errors in that block can be corrected. If correctable, the data read to the selected block and determination concludes. In contrast, when uncorrectable data is included, the screening controller 3c determines that the selected block is a bad block (step S73), and the flow concludes. No read retry is executed. The reasons for this are as follows.

As described above, using the read retry in the normal mode can correctly read data even with the threshold voltages varied due to the program and/or read disturb, and/or data retention deterioration. In contrast, blocks from which data can be correctly read with the read retry highly possibly become bad blocks soon after the shipment. Therefore, blocks which satisfy conditions to trigger the read-retry during the screening are determined to be bad, which results in only good blocks remaining after the shipment. This is why the read retry is not executed during the screening. Moreover, the read retry increases the time taken for the data read because it includes an extra process in addition to without-screening reading. For this reason, classifying blocks which need the read retry as bad blocks during the screening can prevent deterioration of the performance of the shipped semiconductor storage device 1. When uncorrectable read error happens in step S72, refresh sequence need not be executed during the autorun mode.

As described above, according to the semiconductor memory device according to the first embodiment, the read retry is executed in the normal mode, and not during the screening (or in the autorun mode). This can efficiently screen unreliable blocks. Moreover, eliminating blocks expected to become dependent on the read retry soon after the shipment beforehand can suppress the rate of read retry occurance in the early stage during use. This can suppress the deterioration in performance of the semiconductor memory device. Moreover, an increased screening efficiency can reduce the time taken for the screening and test and manufacturing cost.

(Second Embodiment)

Figure 17:
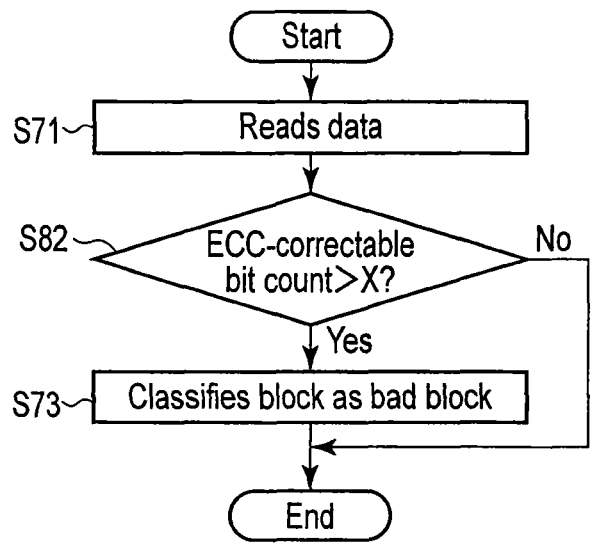
FIG. 17 illustrates a data read flow during screening of a semiconductor memory device according to a second embodiment.

The second embodiment differs from the first embodiment in the data read for the screening. FIG. 17 illustrates a flow of data read during screening of a semiconductor memory device according to the second embodiment, and corresponds to the details of steps S56, S63, and S67 of FIG. 12. The autorun mode firmware causes the storage device controller 3, in particular the screening controller 3c, to execute the data read for the screening shown in FIG. 17. The storage device controller 3, in particular the screening controller 3c, is configured to execute the flow shown in FIG. 17 in accordance with the firmware.

As shown in FIG. 17, step S82 is executed instead of step S72 of FIG. 16. In step S82, the storage device controller 3 checks errors in the read data using the ECC. The screening controller 3c executes a series of processes of steps S71 and S82 to all pages in a selected block, and also counts correctable bits per page, block, or another unit by which ECC correction is executed. The screening controller 3c also determines whether the correctable bit count in the selected block exceeds a threshold X in step S82. When the determination in step S82 is No, the data read and determination for the selected block concludes. In contrast, when the determination in step S82 is Yes, the flow shifts to step S73.

The first embodiment classifies blocks including uncorrectable errors as bad blocks. In other words, even if errors are included in the data read from a block, the block is determined to be good if they can be corrected. However, a block including many error-correctable bits may become uncorrectable even with the error correction due to the program disturb, read disturb, retention deterioration, and the like over time. Moreover, a block including many error-correctable bits may require a long time for data write and read during the use of the semiconductor storage device 1 by users. This may result in failed operation of the semiconductor storage device 1, or reduced user convenience. In consideration of such factors, the screening controller 3c classifies blocks correctable with the error correction but with the error-corrected bit count exceeding a threshold as bad blocks. This can remove blocks that are highly likely to become bad in the future.

The read for the screening according to the second embodiment may only count the error-correctable bits with or without actual correction of errors in the read data.

The read of the second embodiment is applicable to the pre-read and post-read of the first embodiment.

All features pertaining to the second embodiment but not described in the description of the second embodiment are as described in the description of the first embodiment.

As described above, in the semiconductor memory device according to the second embodiment, the read retry is executed in the normal mode and not during the screening (or in the autorun mode) as in the first embodiment. Based on this, the same advantages as those of the first embodiment can be obtained. Moreover, in the data read during the screening in the second embodiment, blocks with the error-correctable bit count exceeding the threshold are classified as bad blocks. This can determine only good quality blocks as good blocks, and hence further suppress the deterioration in performance of the semiconductor memory device.

(Third Embodiment)

Figure 18:
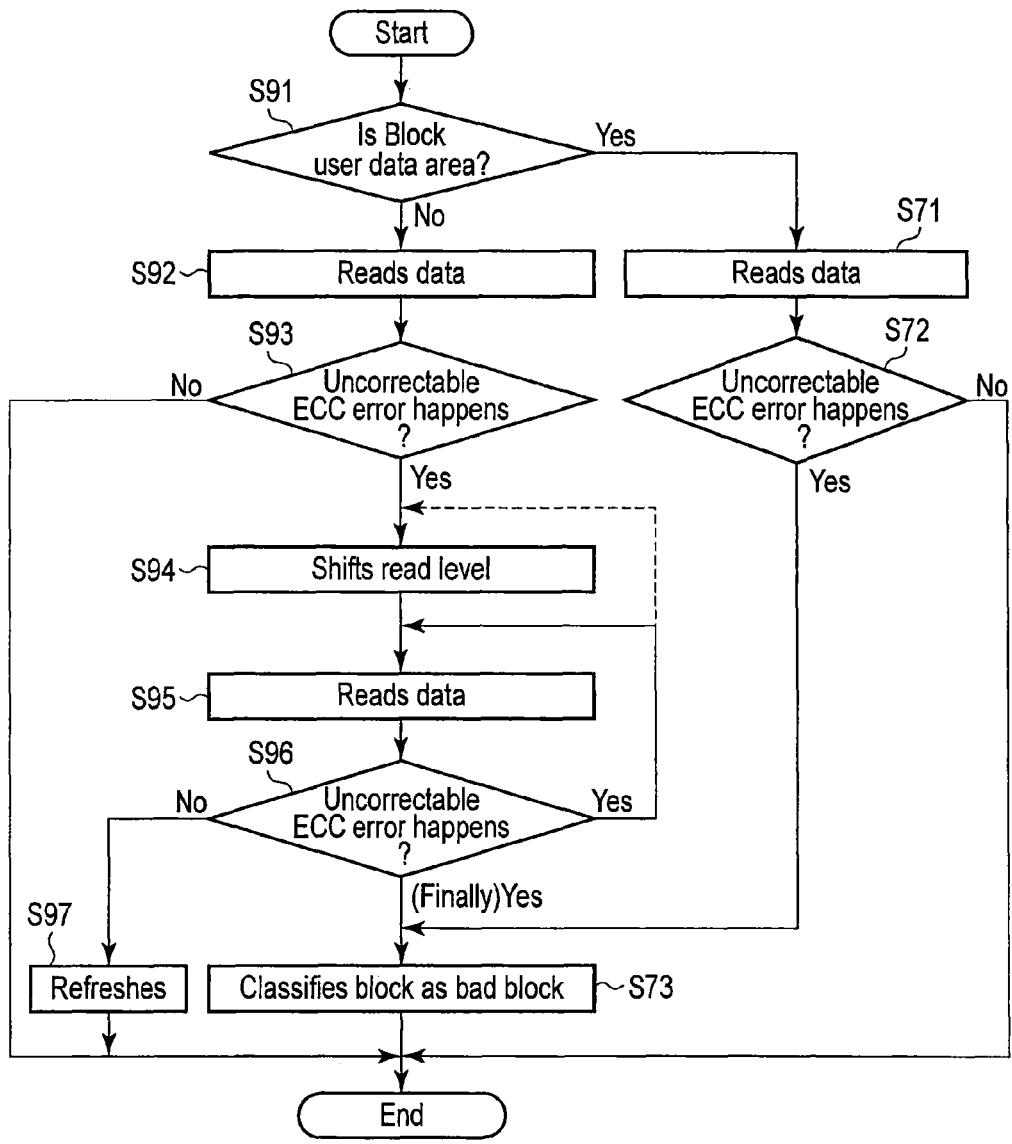
FIG. 18 illustrates a data read flow during screening of a semiconductor memory device according to a third embodiment.

In the third embodiment, data read during screening differs in accordance with read areas in the memory 2. FIG. 18 illustrates a flow of data read during screening of a semiconductor memory device according to the third embodiment, and corresponds to the details of step S56, S63, and S67 of FIG. 12. The autorun mode firmware causes the storage device controller 3, in particular the screening controller 3c, to execute the data read for the screening shown in FIG. 18. The storage device controller 3, in particular the screening controller 3c, is configured to execute the flow shown in FIG. 18 in accordance with the firmware.

As shown in FIG. 18, the storage device controller 3 determines whether a selected block belongs to the user data area 2U, or other areas, such as the firmware area 2F or management information area 2M (step S91). When the determination is Yes, the screening controller 3c executes steps S71 to S73 of FIG. 16. Step S82 of the FIG. 17 of the second embodiment may be executed instead of step S72.

In contrast, when the determination in step S91 is No, the screening controller 3c reads the data from one particular page in the selected block after another through the memory controller 3a (step S92), and corrects errors in the read data using the ECC through the error correction unit 3b (step S93). Step S92 and S93 are the same as step S71 and S72 of FIG. 15, respectively. The screening controller 3c also executes a series of processes of steps S91 and S92 to all pages in the selected block, and determines whether all errors in that block can be corrected. If correctable, the data read to the selected block and determination concludes. In contrast, when uncorrectable data is included, the screening controller 3c executes the read retry and error correction. Specifically, the screening controller 3c shifts the read level from the default value as in steps S31 and S32 of FIG. 10 (step S94), and reads data from the memory cells using the shifted read level (step S95). The screening controller 3c corrects errors in the read data read using the ECC through the error correction unit 3b as in step S33 of FIG. 10, and determines whether the errors cannot be corrected by the ECC (step S96). When the errors can be corrected by the ECC, the screening controller 3c refreshes the read-target memory cells through the memory controller 3a as in step S34 of FIG. 10 (step S97).

In contrast, when the errors cannot be corrected in step S95, step S94 is reexecuted as in the normal mode. Alternatively, the set of steps S93 and S94 may be reexecuted. Also in step S95, when the screening controller 3c determines that the repeat count of step S94 has reached a threshold, the flow shifts to step S73.

As described above, according to the semiconductor memory device according to the third embodiment, the read retry is executed in the normal mode and read of areas other than the user data area of the memory, and not during the screening of the user data area of the memory as in the first embodiment. Based on this, the same advantages as those of the first embodiment can be obtained. Moreover, in the third embodiment, the read retry is executed to the firmware area or management area even in the autorun mode. This can prevent failed read of the firmware area and/or management area in the autorun mode, which may break the semiconductor memory or render it uncontrollable.

(Fourth Embodiment)

The fourth embodiment relates to switching of the normal mode and autorun mode by firmware, and is applicable to any of the first to third embodiments.

Figure 19:
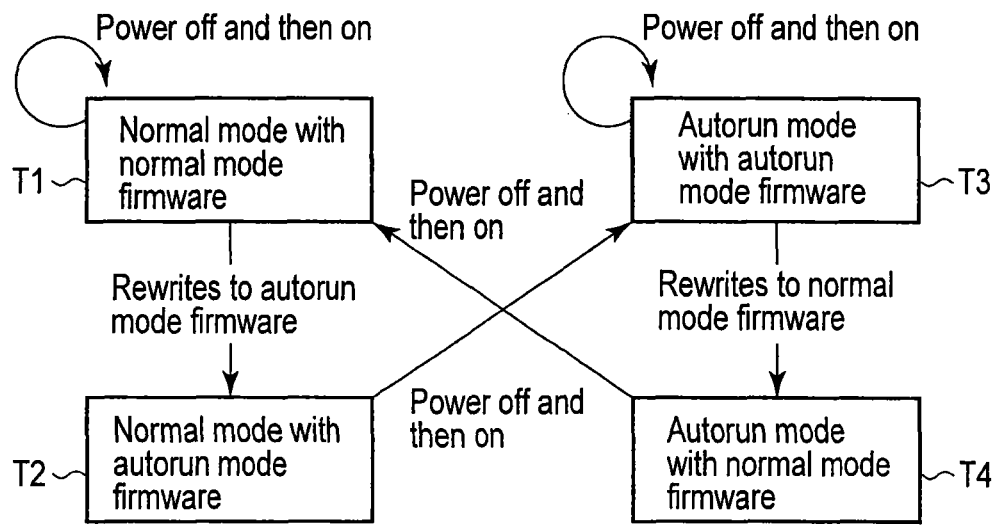
FIG. 19 illustrates an example state transition diagram of a semiconductor memory device in accordance with firmware according to a fourth embodiment.

FIG. 19 illustrates an example of state transition diagram of a semiconductor memory device in accordance with firmware according to the fourth embodiment. In the fourth embodiment, the normal mode firmware and autorun mode firmware are prepared. Assume that the normal mode firmware is already written in the semiconductor storage device 1. When the power is supplied to the semiconductor storage device 1 in this state, the semiconductor storage device 1 boots in the normal mode (state T1). The semiconductor storage device 1 then enters state T1 whenever the power to the semiconductor storage device 1 is cut off and then resupplied.

In contrast, when the normal mode firmware is rewritten by the autorun mode firmware in state T1, the semiconductor storage device 1 shifts to state T2. Rewriting the firmware can be implemented with commands defined in the interface which the semiconductor storage device 1 supports as described above. For example, Download Microcode compliant with ASC-2 may be used as described above. For example, 11h Firmware Image Download command in NVM Express Revision 1.1 Oct. 11, 2012 (see http://www.nvmexpress.org/) may be used as described above. The normal mode firmware and autorun mode firmware are stored in a server coupled to the internet or intranet, for example. A tester device 43 of FIG. 20 is communicatively coupled to the server through the internet or intranet connection, the firmware is then downloaded to the tester device 43 through the internet or intranet connection, and the firmware is written in the firmware area 2F of the semiconductor storage device 1 using the above command through the interface 11 by the tester device 43.

The interface used to write the firmware may be a UART interface 101 instead of the interface 11 as shown in FIG. 21. The storage device controller 3 communicates with the tester device 43 via the UART controller 102 and UART interface 101.

Alternatively, the normal mode firmware and autorun mode firmware may be stored in an optical medium such as a DVD-ROM, or nonvolatile memory media such as a USB memory. The tester device 43 for the semiconductor storage device 1 is coupled to these storage media, and the firmware is written in the firmware area 2F of the semiconductor storage device 1 by the tester device 43 using the above command through the interface 11.

When the power to the semiconductor storage device 1 in the state T2 is cut off and then resupplied thereto, the semiconductor storage device 1 boots in the autorun mode and shifts to state T3. The semiconductor storage device 1 in state T3 enters state T3 whenever the power to the semiconductor storage device 1 is cut off and then resupplied. In other words, it boots in the autorun mode. In the semiconductor storage device 1 in state T3, the screening is executed in accordance with the first embodiment, second embodiment, and/or third embodiment. After completion of the screening, the autorun mode firmware is rewritten by the normal mode firmware with the tester device 43, and the semiconductor storage device 1 shifts to state T4. When the power to the semiconductor storage device 1 in the state T4 is cut off and the resupplied, the semiconductor storage device 1 boots in the normal mode and shifts to state T1.

The tester device 43 has substantially the same topology and connection to the semiconductor storage device 1 as the host device 10 of FIG. 1, and is used for pretreatment before the screening and/or test process after the screening. As shown in FIG. 20, before the screening, the semiconductor storage device 1 and tester device 43 are coupled via the power source line 12 and interface 11 as in FIG. 1. The firmware area 2F is then rewritten (or the state T2 is reached from the state T1), the power source line 12 and interface 11 are uncoupled between the semiconductor storage device 1 and tester device 43, and the semiconductor storage device 1 and power unit 40 are coupled with the power source line 12 to result in shifting to the state T3, and the screening is automatically started. After completion of the screening, the power source line 12 is uncoupled between the semiconductor storage device 1 and power unit 40, the semiconductor storage device 1 and tester device 43 are coupled with the power source line 12 and interface 11, the firmware area 2F is rewritten (or state T4 is reached from the state T3), and the power source line 12 is coupled again after cut off of the power. Thus, the state ends up being T1.

It has been described that the transition from state T2 to T3 and T1 from T4 does not take place unless power off and then on is passed through after rewriting of the firmware area 2F with the Download Microcode command. However, state transition of T1 to T2 to T3 and/or T3 to T4 to T1 may occur immediately after the reception of the Download Microcode command without power off then on. It is also possible to use a command which causes the firmware to process an internal reset which causes pseud power off and pseud power on instead of actual power off and then on.

The description has been made from the state with the normal mode firmware written for convenience. The description, however, equally applies to a case where the state starts from a case in which the autorun mode firmware is written in the semiconductor storage device 1 (state T3).

Figure 22:
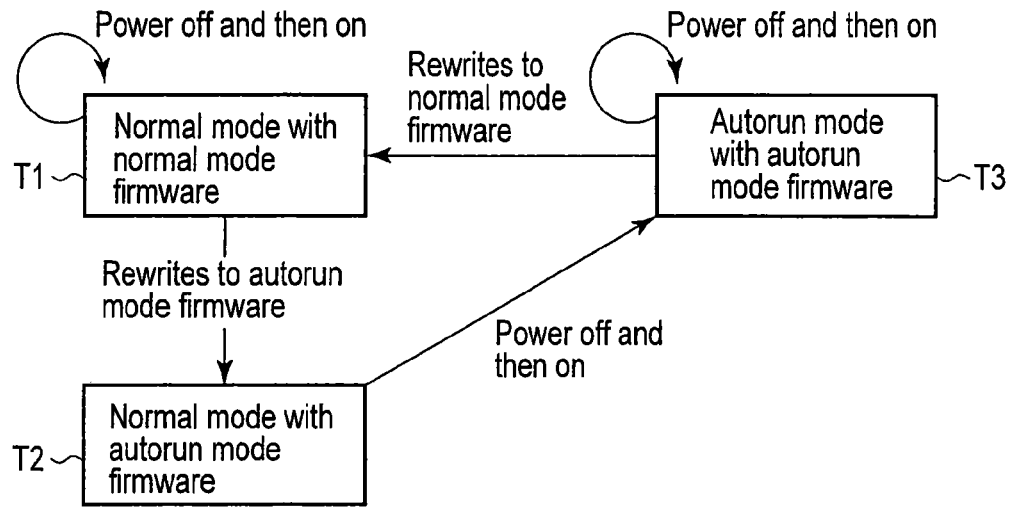
FIG. 22 illustrates another example transition of modes of the semiconductor memory device in accordance with firmware according to the fourth embodiment.

Moreover, when the firmware is rewritten by the normal mode firmware in the state T3 in the example of FIG. 19, the state shifts to state T4 and then to state T1 through power off then on. However, as shown in FIG. 22, when the firmware is rewritten by the normal mode firmware in state T3, the state may directly shift to state T1 without passing through state T4 or power off and on.

As described above, in the fourth embodiment, the normal mode firmware and autorun mode firmware are prepared. This makes it possible to process and/or develop the normal mode and autorun mode clearly separately, and hence prevent malfunction of the screening processor in the normal mode and/or erroneous execution of the read retry during the screening. Moreover, it is possible to develop the normal mode firmware and autorun mode firmware by separate development teams, which is desirable in terms of the efficiency of development of the firmware. Furthermore, the autorun mode firmware is rewritten by the normal mode firmware before the shipment of the semiconductor memory device, and hence it is possible to prevent reverse engineering of what is executed by the autorun mode firmware in the shipped storage device.

(Fifth Embodiment)

The fifth embodiment relates to switching of the normal mode and autorun mode by firmware, and is applicable to any of the first to third embodiments.

The fifth embodiment differs from the fourth embodiment in how to switch the modes.

Figure 23:
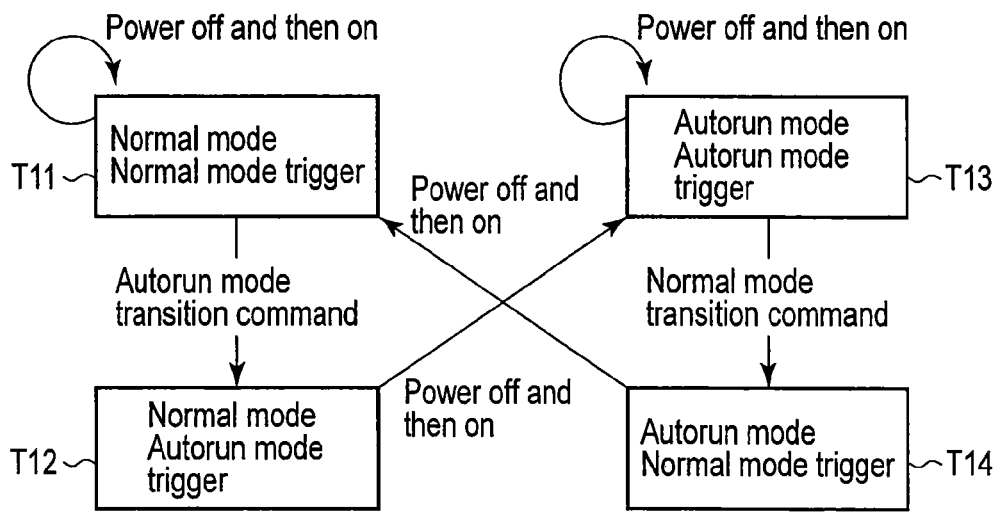
FIG. 23 illustrates an example transition of modes of a semiconductor memory device in accordance with firmware according to a fifth embodiment.

FIG. 23 illustrates an example of mode shift of a semiconductor memory device in accordance with firmware according to the fifth embodiment. In the fifth embodiment, the firmware includes sections for both the normal and autorun modes. Assume again that the semiconductor storage device 1 boots in the normal mode (state T11). In this state, the semiconductor storage device 1 enters the state T11 whenever the power to the semiconductor storage device 1 is cut off and then resupplied.

In the state T11, the semiconductor storage device 1 is made to shift to state T12 by a command issued from the tester device 43. The command may be a command defined in the interface which the semiconductor storage device 1 supports as described above. For example, the SCT command compliant with the INCITS ACS-2 or another vendor specific command is used as described above. The command is received in the storage device controller 3.

When the power to the semiconductor storage device 1 in the state T12 is cut off and then resupplied thereto, the semiconductor storage device 1 boots in the autorun mode and shifts to state T13. The semiconductor storage device 1 in state T13 enters state T13 whenever the power to the semiconductor storage device 1 is cut off and the resupplied. In other words, it boots in the autorun mode. In the semiconductor storage device 1 in the state T13, the screening is executed in accordance with the first embodiment, second embodiment, and/or third embodiment. The semiconductor storage device 1 is brought to state T14 by a command after completion of the screening. When the power to the semiconductor storage device 1 in the state T14 is cut off and then resupplied, the semiconductor storage device 1 boots in the normal mode and shifts to state T11.

The tester device 43 is coupled to the semiconductor storage device 1 with the power source line 12 and interface 11 before the screening as in the fourth embodiment (FIGS. 20 and 21). A transition command from state T11 to T12 is then issued from the tester device 43, and the power source line 12 and interface 11 are decoupled between the semiconductor storage device 1 and tester device 43. The semiconductor storage device 1 and power unit 40 are then coupled with the power source line 12 to result in shifting to state T13, the screening is started, and the power source line 12 is decoupled between the semiconductor storage device 1 and power unit 40 after the screening. The semiconductor storage device 1 and tester device 43 are then coupled with the power source line 12 and interface 11, a transition command from state T13 to T14 is then issued from the tester device 43, and the power source line 12 is again coupled after it is cut off. Thus, the state ends up with T11.

It has been described that the transition from state T12 to T13 and T11 from T14 does not take place unless power off and then on is passed through after rewriting of the firmware area 2F with the state change command. However, state transition of T11 to T12 to T13 and/or T13 to T14 to T11 may occur immediately after the reception of the state change command without power off then on. Moreover, it is possible to use a command which causes the firmware to process an internal reset which causes pseud power off and pseud power on instead of actual power off and then on.

As described above, in the fifth embodiment, the transition command is used to switch the normal mode and autorun mode. This allows the respective functions of the normal and autorun modes to coexist in the same firmware. This in turn prevents extra firmware rewriting during testing of the semiconductor memory device, which is desirable in terms of an increased efficiency or simplified management in the test, and/or risk hedging of firmware rewriting failures. Moreover, the functions of the normal and autorun modes can be developed in the same firmware to enable unified management of the firmware in the development phase, which is desirable in terms of project management.

(Sixth Embodiment)

The sixth embodiment relates to the autorun mode during boot of the semiconductor memory device.

FIG. 24 schematically illustrates a block diagram of a semiconductor memory device according to the sixth embodiment. As shown in FIG. 24, the semiconductor storage device 1 includes a temperature sensor 51 as well as the functional blocks shown in FIG. 1. The temperature sensor 51 is coupled to the storage device controller 3.

FIG. 25 illustrates a flow during boot of the semiconductor memory device according to the sixth embodiment. The boot according to the sixth embodiment differs from that shown in FIG. 2 in operation from step S9 to S10. As shown in FIG. 25, when the determination in step S9 is Yes, the semiconductor storage device 1 waits for a period of time (step S13). The screening is desirably executed while the semiconductor storage device 1 is under heat stress in order to raise its efficiency and reliability, and hence the screening of the semiconductor storage device 1 may be executed in the thermostatic oven 41, as shown in FIG. 15. In such a case, the semiconductor storage device 1 waits in step S13 while the temperature increases until the semiconductor storage device 1 reaches a desired temperature.

The storage device controller 3 then determines whether the temperature indicated by a signal from the temperature sensor 51 has exceeded a threshold TX (step S14). The threshold TX is the temperature which the semiconductor storage device 1 is intended to have during the screening. Although a thermometer is usually present in the thermostatic oven 41, the temperature of the semiconductor storage device 1 can be more strictly controlled by directly monitoring the temperature of the semiconductor storage device 1. When the determination in step S14 is No, the flow returns to step S13, and with Yes the semiconductor storage device 1 enters the autorun mode (step S10).

All features pertaining to the sixth embodiment but not described in the description of the sixth embodiment are as described in the description of the first embodiment. Moreover, any one or more of the second to fifth embodiments can be applied to the sixth embodiment as they are applicable to the first embodiment.

As described above, according to the semiconductor memory device according to the sixth embodiment, the read retry is executed in the normal mode, and not during the screening (or in the autorun mode) as in the first embodiment. Based on this, the same advantages as those of the first embodiment can be obtained. Moreover, in the sixth embodiment, the semiconductor storage device 1 enters the autorun mode in accordance with the temperature of the semiconductor storage device 1. For this reason, the stress process can be executed with a highly-precisely controlled temperature without being influenced by the temperature control of the thermostatic oven 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a semiconductor memory comprising blocks, the blocks including memory cells; and
a memory controller,
wherein
the semiconductor memory stores a firmware for causing the memory controller to operate in at least one of a first mode and a second mode; and
the memory controller
writes substantial data and redundant data in the semiconductor memory,
reads substantial data and corresponding redundant data from the semiconductor memory, and corrects an error, if any, in the read substantial data based on the read redundant data,
reads the firmware when power is supplied, and enters the first or second mode in accordance with the firmware when the firmware is executed by the memory controller,
in the first mode, for each of the blocks, erases data, writes data, and reads the written data, corrects errors of the read data, and determines that the block or the semiconductor storage device is defective when the read data is uncorrectable, and
in the second mode, reads substantial data from the semiconductor memory using a first read level, corrects an error in the read substantial data when the error in the read substantial data is detected, reads the substantial data using a second read level when the error correction of the read substantial data fails, the second read level being shifted from the first read level.

2. The device of claim 1, wherein
the second read level is higher than the first read level, and
the memory controller, when error correction of the substantial data read from the semiconductor memory using the second read level fails, reads the substantial data using a third read level, the third read level is lower than the first read level.

3. The device of claim 1, wherein
the memory controller, when error correction of the substantial data read from the semiconductor memory using the second read level succeeds, refreshes a memory cell including the substantial data, and
the memory controller, when error correction of the substantial data read from the semiconductor memory by using the second read level fails, registers a block including the substantial data as a bad block.

4. The device of claim 1, wherein in the first mode the memory controller reads data before the data erase, and then determines that the block or the semiconductor storage device is defective when the read data is uncorrectable.

5. The device of claim 1, wherein, in the first mode, the memory controller counts errors of the read data and determines that the read data is uncorrectable when a count of errors in the read data exceeds a threshold.

6. The device of claim 1, wherein in the first mode the memory controller reads data in the blocks using a third read level, and when error correction of the read data fails, the memory controller reads the data which failed in the error correction using a fourth read level, the fourth read level being shifted from the third read level.

7. The device of claim 6, wherein in the first mode the memory controller
when correction of errors in data read from a first area of the semiconductor memory fails, reads the data which failed in the error correction using the fourth read level, and
when correction of errors in data read from a second area of the semiconductor memory fails, does not read the data which failed in the error correction using the fourth read level.

8. The device of claim 7, wherein
the first area includes at least one of a firmware area and a management information area, and
the second area includes a user data area.

9. The device of claim 1, wherein whether the firmware causes the semiconductor storage device to operate in the first or second mode after cut off of power and the following resupply of the power to the semiconductor storage device is switched by a received command.

10. The device of claim 1, further comprising a temperature sensor, wherein the memory controller enters the first mode after a temperature measured by the temperature sensor exceeds a threshold.

11. A method of controlling a semiconductor memory, the semiconductor memory comprising blocks including memory cells, the semiconductor memory storing a firmware used to operate in a first mode or a second mode, the method comprising:
reading the firmware from the semiconductor memory;
entering the first or second mode based on the read firmware;
in a first mode,
for each of the blocks, erasing data, writing data, reading the written data, correcting errors of the read data, and determining that the block or the semiconductor memory is defective when the read data is uncorrectable; and
in a second mode,
writing substantial data and redundant data in the semiconductor memory,
reading substantial data from the semiconductor memory using a first read level,
correcting an error, in the read substantial data when the error in the read substantial data is detected,
when the error correction of the read substantial data fails, reading the substantial data using a second read level, the second read level being shifted from the first read level.

12. The method of claim 11, wherein
the second read level is higher than the first read level,
the method further comprises reading, when error correction of the substantial data read from the semiconductor memory using the second read level fails, the substantial data using a third read level, and
the third read level is lower than the first read level.

13. The method of claim 1, further comprising:
refreshing, when error correction of the substantial data read from the semiconductor memory using the second read level succeeds, a memory cell, the memory cell storing the substantial data; and
registering, when error correction of the substantial data read from the semiconductor memory by using the second read level fails, a block including the substantial data as a bad block.

14. The method of claim 1, further comprising:
in the first mode,
reading data before the data erase; and
determining that the block or the semiconductor memory is defective when the read data is uncorrectable.

15. The method of claim 1, further comprising:
in the first mode,
counting errors of the read data; and
determining that read data is uncorrectable when a count of errors in the read data exceeds a threshold.

16. The method of claim 1, further comprising:
in the first mode,
reading data in the blocks using a third read level; and
reading, when error correction of the read data fails, data which failed in the error correction using a fourth read level,
wherein the fourth read level is shifted from the third read level.

17. The method of claim 16, further comprising:
in the first mode,
reading, when correction of errors in data read from a first area of the semiconductor memory fails, the data which failed in the error correction using the fourth read level, and
not reading, when correction of errors in data read from a second area of the semiconductor memory fails, the data which failed in the error correction using the fourth read level.

18. The method of claim 17, wherein
the first area includes at least one of a firmware area and a management information area, and
the second area includes a user data area.

19. The method of claim 1, wherein whether the semiconductor memory enters the first or second mode after cut off of power and the following resupply of the power to the semiconductor memory is switched by a received command.

20. The method of claim 1, further comprising entering the first mode after a temperature measured by a temperature sensor exceeds a threshold.

* * * * *